United States Patent
Kao et al.

(10) Patent No.: US 9,875,989 B2
(45) Date of Patent: Jan. 23, 2018

(54) SEMICONDUCTOR DEVICE STRUCTURE

(71) Applicant: TAIWAN SEMICONDUCTOR MANUFACTURING CO., LTD., Hsinchu (TW)

(72) Inventors: Min-Feng Kao, Chiayi (TW); Dun-Nian Yaung, Taipei (TW); Jen-Cheng Liu, Hsinchu (TW); Jeng-Shyan Lin, Tainan (TW); Hsun-Ying Huang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/993,603

(22) Filed: Jan. 12, 2016

(65) Prior Publication Data
US 2017/0200697 A1 Jul. 13, 2017

(51) Int. Cl.
*H01L 25/065* (2006.01)

(52) U.S. Cl.
CPC ...... *H01L 25/0655* (2013.01); *H01L 2224/11* (2013.01); *H01L 2225/06544* (2013.01); *H01L 2225/06558* (2013.01); *H01L 2225/06586* (2013.01)

(58) Field of Classification Search
CPC ............. H01L 25/0655; H01L 25/0657; H01L 27/146; H01L 27/14632; H01L 2225/06544; H01L 2225/06558; H01L 2225/06586

USPC .................. 257/291, 294, 651, 737
See application file for complete search history.

(56) References Cited

U.S. PATENT DOCUMENTS

| | | |
|---|---|---|
| 5,973,375 A | 10/1999 | Baukus et al. |
| 5,985,739 A | 11/1999 | Plettner et al. |
| 2012/0252208 A1 | 10/2012 | Jang et al. |
| 2013/0099098 A1* | 4/2013 | Kobayashi ........ H01L 27/14632 250/208.1 |
| 2013/0285179 A1 | 10/2013 | Lin et al. |
| 2013/0299931 A1 | 11/2013 | Chuang et al. |
| 2013/0307103 A1 | 11/2013 | Lin et al. |
| 2014/0054662 A1* | 2/2014 | Yanagita ........... H01L 27/14629 257/291 |
| 2015/0115389 A1 | 4/2015 | Chuang et al. |
| 2015/0140722 A1 | 5/2015 | Chuang et al. |

* cited by examiner

*Primary Examiner* — Johannes P Mondt
(74) *Attorney, Agent, or Firm* — Eschweiler & Potashnik, LLC

(57) ABSTRACT

A semiconductor device structure is provided. The semiconductor device structure includes a semiconductor substrate having a first surface and a second surface. The semiconductor substrate has an active region. The semiconductor substrate is doped with first dopants with a first-type conductivity. The active region is adjacent to the first surface and doped with second dopants with a second-type conductivity. The semiconductor device structure includes a doped layer over the second surface and doped with third dopants with the first-type conductivity. A first doping concentration of the third dopants in the doped layer is greater than a second doping concentration of the first dopants in the semiconductor substrate. The semiconductor device structure includes a conductive bump over the doped layer.

20 Claims, 27 Drawing Sheets

SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

Over the course of IC evolution, functional density (i.e., the number of interconnected devices per chip area) has generally increased while geometric size has decreased. The thicknesses of semiconductor device structures (e.g., chips or packages) have decreased as well.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1I-1 to 1I-3 are cross-sectional views of variations of the semiconductor device structure of FIG. 1I, in accordance with some embodiments.

FIG. 2 is a cross-sectional view of a semiconductor device structure, in accordance with some embodiments.

FIGS. 3E-1 to 3E-3 are cross-sectional views of variations of the semiconductor device structure of FIG. 3E, in accordance with some embodiments.

FIGS. 4C-1 to 4C-3 are cross-sectional views of variations of the semiconductor device structure of FIG. 4C, in accordance with some embodiments.

DETAILED DESCRIPTION

Figure 1A:
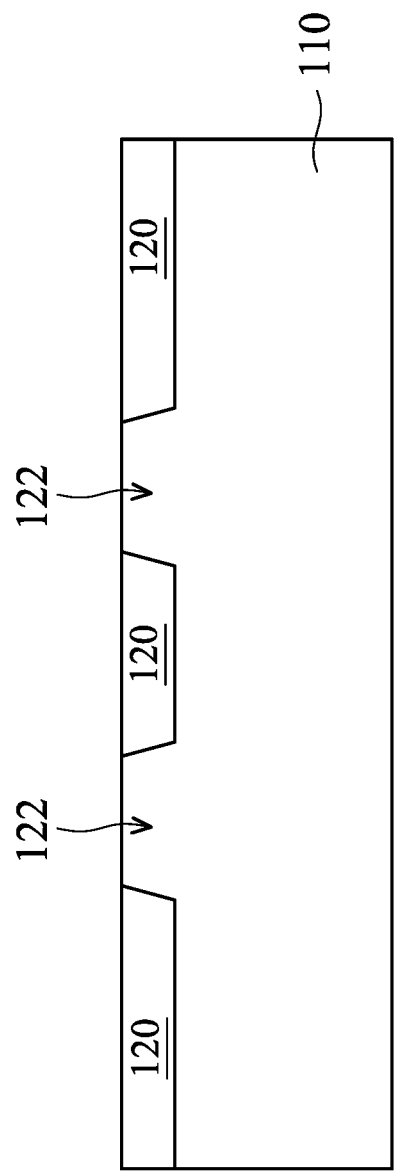
FIGS. 1A-1I are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1I are cross-sectional views of various stages of a process for forming a semiconductor device structure 100, in accordance with some embodiments. FIGS. 1I-1 to 1I-3 are cross-sectional views of variations of the semiconductor device structure 100 of FIG. 1I, in accordance with some embodiments.

As shown in FIG. 1A, a semiconductor substrate 110 is provided. The semiconductor substrate 110 may be a semiconductor wafer (such as a silicon wafer) or a portion of a semiconductor wafer. In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor, such as silicon carbide, gallium arsenide, gallium phosphide, indium phosphide, indium arsenide, an alloy semiconductor, such as SiGe, or GaAsP, or a combination thereof.

The semiconductor substrate 110 may also include multi-layer semiconductors, semiconductor on insulator (SOI) (such as silicon on insulator or germanium on insulator), or a combination thereof. The semiconductor substrate 110 is doped with first dopants (not shown), in accordance with some embodiments. The first dopants have a first-type conductivity, in accordance with some embodiments. In some embodiments, the first-type conductivity is P-type. The first dopants include Group IIIA elements, such as boron (B) or aluminum (Al), in accordance with some embodiments. The semiconductor substrate 110 is a P-type semiconductor substrate, in accordance with some embodiments.

As shown in FIG. 1A, an isolation structure 120 is formed in the semiconductor substrate 110, in accordance with some embodiments. The isolation structure 120 is embedded in the semiconductor substrate 110, in accordance with some embodiments. The isolation structure 120 has openings 122 to define various active regions in the semiconductor substrate 110, in accordance with some embodiments. The isolation structure 120 is configured to electrically isolate neighboring active regions from one another, in accordance with some embodiments. The isolation structure 120 includes a dielectric material, in accordance with some embodiments.

The dielectric material includes silicon oxide, silicon nitride, silicon oxynitride, fluoride-doped silicate glass (FSG), a low-K dielectric material, another suitable material, or a combination thereof, in accordance with some embodiments. The isolation structure 120 is formed by using an isolation technology, such as local oxidation of semiconductor (LOCOS), shallow trench isolation (STI), or the like, in accordance with some embodiments.

In some embodiments, the formation of the isolation structure 120 includes patterning the semiconductor substrate 110 by performing a photolithography process, etching a trench in the semiconductor substrate 110, and filling the trench with the dielectric material. In some embodiments, the filled trench has a multi-layer structure, such as a thermal oxide liner layer filled with silicon nitride or silicon oxide.

Figure 1B:
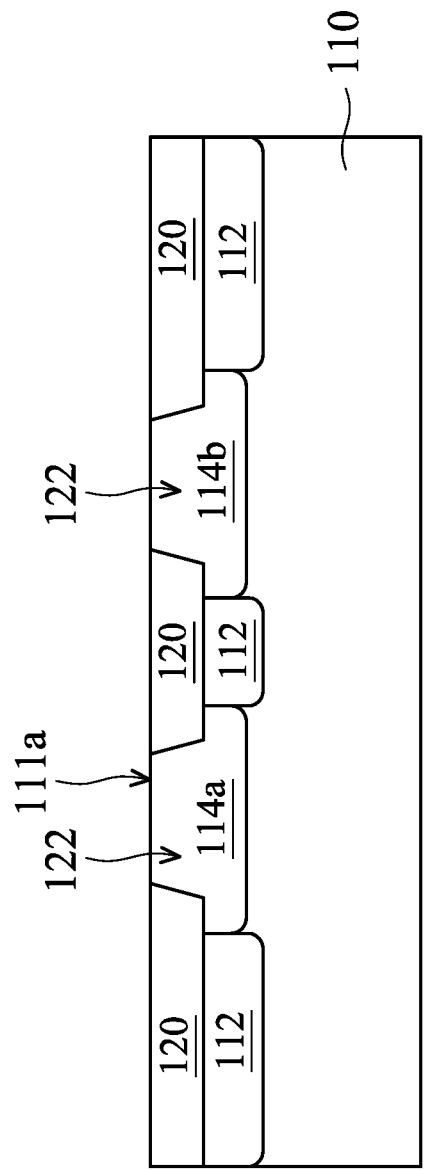

As shown in FIG. 1B, isolation doped regions 112 and active regions 114a and 114b are formed in the semiconductor substrate 110, in accordance with some embodiments. The isolation doped regions 112 are formed under the isolation structure 120, in accordance with some embodiments. The active regions 114a and 114b are formed in and under the openings 122, in accordance with some embodiments.

The active regions 114a and 114b are adjacent to the surface 111a of the semiconductor substrate 110, in accordance with some embodiments. The isolation structure 120 surrounds the active regions 114a and 114b, in accordance with some embodiments. The isolation doped region 112 is formed between the active regions 114a and 114b to electrically isolate the active region 114a from the active region 114b, in accordance with some embodiments. The doped region 114a or 114b is formed between two adjacent isolation doped regions 112, in accordance with some embodiments.

The isolation doped regions 112 are doped with dopants (not shown) with the first-type conductivity, in accordance with some embodiments. In some embodiments, the first-type conductivity is P-type. In some embodiments, the dopants in the isolation doped regions 112 include Group IIIA elements, such as boron (B) or aluminum (Al). The semiconductor substrate 110 and the isolation doped regions 112 are doped with dopants with the same type of conductivity, in accordance with some embodiments. In some embodiments, a doping concentration of the dopants in the isolation doped regions 112 is greater than a doping concentration of the first dopants in the semiconductor substrate 110.

The active regions 114a and 114b are doped with second dopants (not shown), in accordance with some embodiments. The second dopants have a second-type conductivity, in accordance with some embodiments. The first-type conductivity is different from the second-type conductivity, in accordance with some embodiments. In some embodiments, the first-type conductivity is P-type, and the second-type conductivity is N-type. The second dopants include Group VA elements, such as nitrogen (N) or phosphorus (P), in accordance with some embodiments.

Figure 1C:
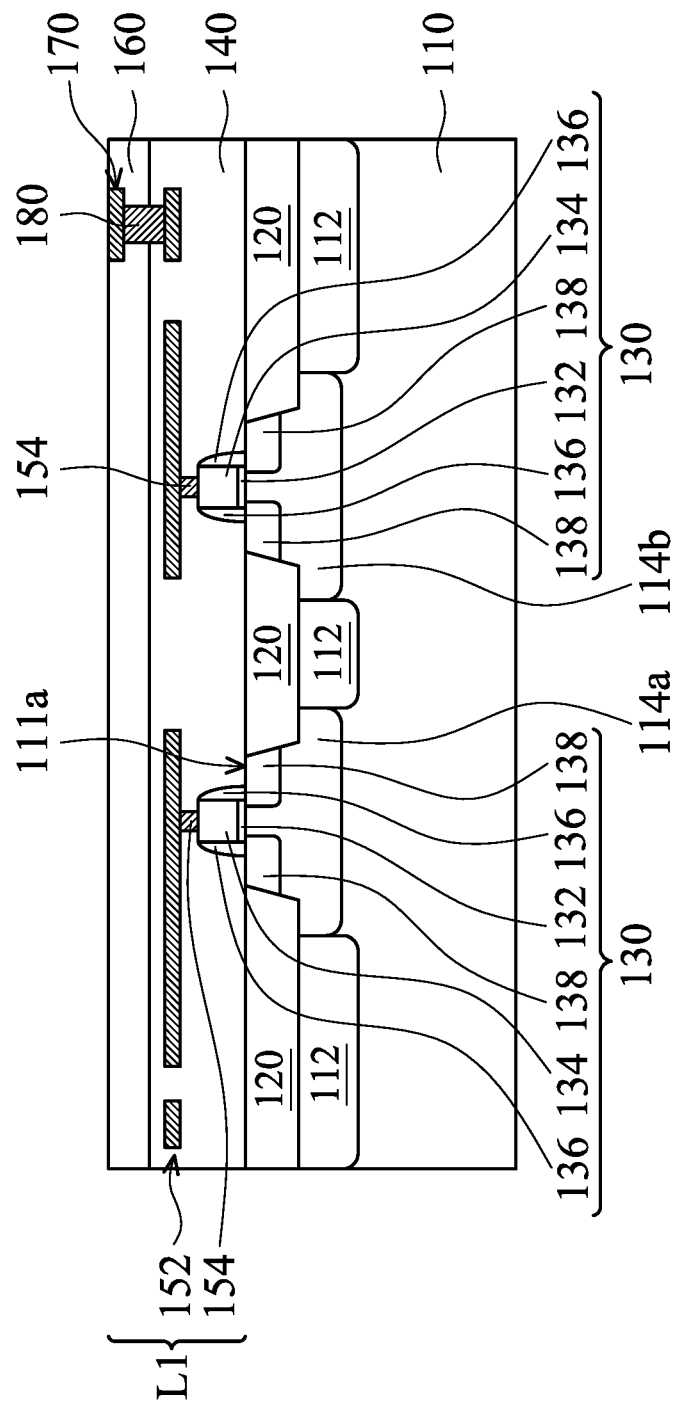

As shown in FIG. 1C, devices 130 are formed in and over the active regions 114a and 114b, respectively, in accordance with some embodiments. In some embodiments, the devices 130 include transistors. Each of the devices 130 includes a gate dielectric layer 132, a gate 134, a spacer layer 136, a source region 138, and a drain region 138, in accordance with some embodiments.

The gate dielectric layer 132 is formed over the active regions 114a and 114b, in accordance with some embodiments. In some embodiments, the gate dielectric layer 132 includes a high dielectric constant material (high-k material), in accordance with some embodiments. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments.

The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments.

The gate 134 is formed over the gate dielectric layer 132, in accordance with some embodiments. The gate 134 is made of polysilicon, metal, or another suitable material, in accordance with some embodiments.

As shown in FIG. 1C, a spacer layer 136 is formed over sidewalls of the gate 134 and the gate dielectric layer 132, in accordance with some embodiments. The spacer layer 136 includes a dielectric material, such as silicon nitride, silicon oxynitride, or a combination thereof, in accordance with some embodiments.

As shown in FIG. 1C, the source region 138 and the drain region 138 are formed in the active regions 114a and 114b and on opposite sides of the gates 134, in accordance with some embodiments. The source region 138 and the drain region 138 are formed using an implantation process, in accordance with some embodiments.

The source region 138 includes a heavily doped source region, in accordance with some embodiments. The drain region 138 includes a heavily doped drain region, in accordance with some embodiments. The source region 138 and the drain region 138 are formed after the formation of the spacer layer 136, in accordance with some embodiments.

As shown in FIG. 1C, a dielectric layer 140 is formed over the surface 111a of the semiconductor substrate 110, in accordance with some embodiments. The dielectric layer 140 covers the devices 130 and the isolation structure 120, in accordance with some embodiments. The dielectric layer 140 is a multi-layer structure, in accordance with some embodiments. The dielectric layer 140 includes dielectric layers stacked with each other (not shown), in accordance with some embodiments.

The dielectric layer 140 is made of any suitable dielectric material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 140 is formed by any suitable process, such as a CVD process, HDPCVD process, spin-on process, sputtering process, or a combination thereof, in accordance with some embodiments.

As shown in FIG. 1C, a wiring layer 152 is formed in the dielectric layer 140, in accordance with some embodiments. The wiring layer 152 is made of any suitable conductive material, such as copper, a copper alloy, silver, gold, aluminum, or a combination thereof. As shown in FIG. 1C, conductive via structures 154 are formed in the dielectric layer 140, in accordance with some embodiments.

The conductive via structures 154 electrically connect the wiring layer 152 to the gates 134, in accordance with some embodiments. The conductive via structures 154 are made of any suitable conductive material, such as copper, a copper alloy, silver, gold, aluminum, or a combination thereof.

As shown in FIG. 1C, a passivation layer 160 is formed over the dielectric layer 140, in accordance with some embodiments. The passivation layer 160 is made of any suitable dielectric material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The passivation layer 160 is formed by any suitable process, such as a CVD process, HDPCVD process, spin-on process, sputtering process, or a combination thereof, in accordance with some embodiments.

In some embodiments, a wiring layer 170 is embedded in the passivation layer 160. The wiring layer 170 is exposed by the passivation layer 160, in accordance with some embodiments. The wiring layer 170 is made of any suitable conductive material, such as copper, a copper alloy, silver, gold, aluminum, or a combination thereof.

As shown in FIG. 1C, a conductive via structure 180 is formed in the dielectric layer 140 and the passivation layer 160, in accordance with some embodiments. The conductive via structure 180 electrically connects the wiring layer 152 to the wiring layer 170, in accordance with some embodiments. The conductive via structure 180 is made of any suitable conductive material, such as copper, a copper alloy, silver, gold, aluminum, or a combination thereof. In some embodiments, the devices 130, the dielectric layer 140, the wiring layer 152, the conductive via structures 154, the passivation layer 160, the wiring layer 170, and the conductive via structure 180 together form a device layer L1.

Figure 1D:
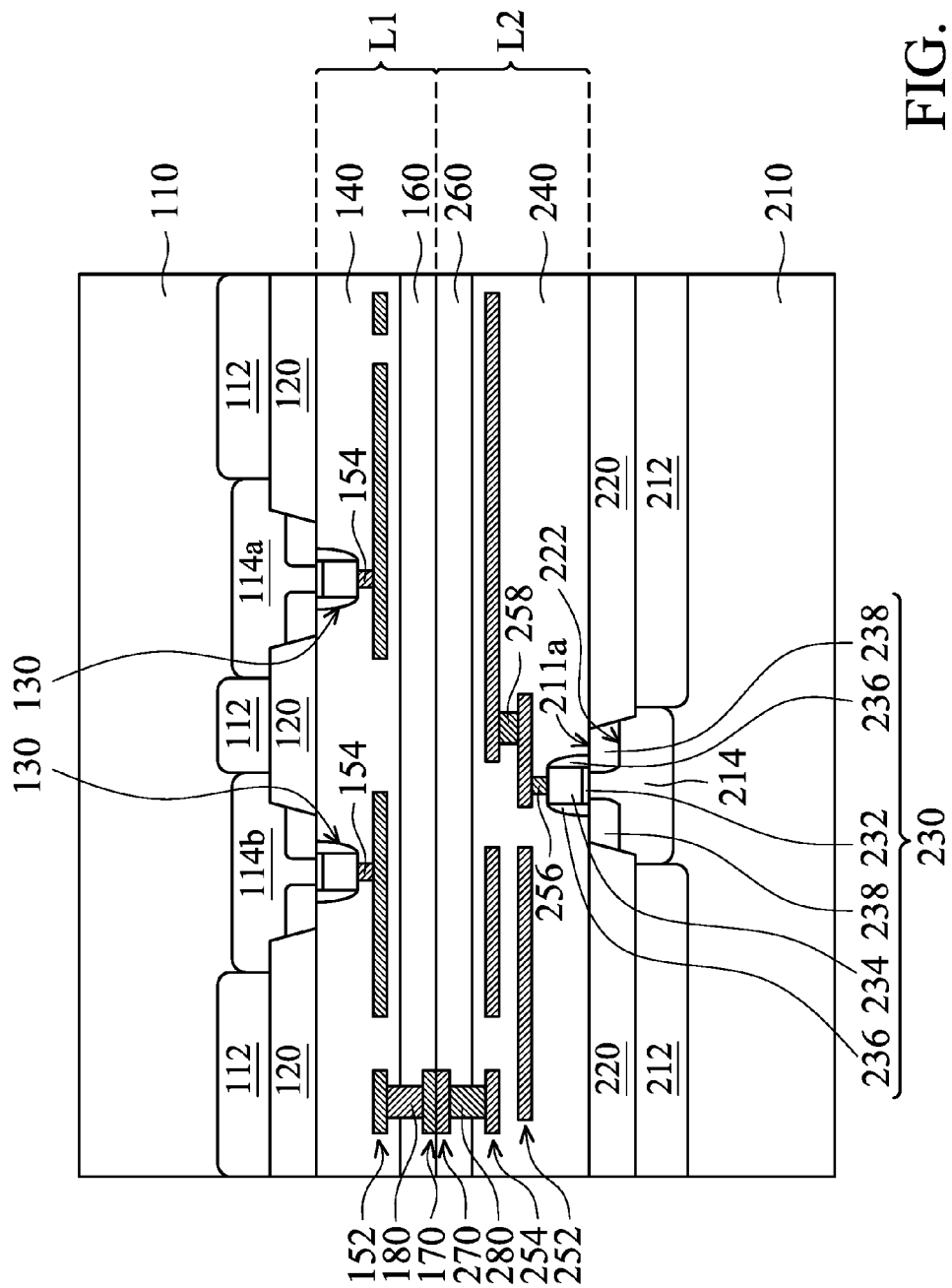

As shown in FIG. 1D, a substrate 210 is provided, in accordance with some embodiments. The substrate 210 may be a semiconductor wafer (such as a silicon wafer) or a portion of a semiconductor wafer. In some embodiments, the semiconductor substrate 210 is made of an elementary semiconductor material including silicon or germanium in a single crystal, polycrystal, or amorphous structure.

In some other embodiments, the semiconductor substrate 210 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 210 may also include multi-layer semiconductors, semiconductor on insulator (SOI) (such as silicon on insulator or germanium on insulator), or a combination thereof. The semiconductor substrate 210 includes a P-type semiconductor substrate or an N-type semiconductor substrate, in accordance with some embodiments.

As shown in FIG. 1D, an isolation structure 220 is formed in the semiconductor substrate 210, in accordance with some embodiments. The isolation structure 220 has an opening 222 to define an active region in the semiconductor substrate 210, in accordance with some embodiments. The isolation structure 220 includes a dielectric material, in accordance with some embodiments.

As shown in FIG. 1D, isolation doped regions 212 and active regions 214 are formed in the semiconductor substrate 210, in accordance with some embodiments. The isolation doped regions 212 are formed under the isolation structure 120, in accordance with some embodiments. The active regions 214 are formed in and under the openings 222, in accordance with some embodiments. The active regions 214 are adjacent to the surface 211a of the semiconductor substrate 210, in accordance with some embodiments. The doped region 214 is formed between two adjacent isolation doped regions 212, in accordance with some embodiments. The isolation doped regions 212 surround the active regions 214, in accordance with some embodiments.

The isolation doped regions 212 are doped with dopants (not shown) with the first-type conductivity, in accordance with some embodiments. In some embodiments, the first-type conductivity is P-type. In some embodiments, the dopants in the isolation doped regions 212 include Group IIIA elements, such as boron (B) or aluminum (Al). The semiconductor substrate 210 and the isolation doped regions 212 are doped with dopants with the same type of conductivity, in accordance with some embodiments.

The active regions 214 are doped with second dopants (not shown), in accordance with some embodiments. The second dopants have a second-type conductivity, in accordance with some embodiments. The first-type conductivity is different from the second-type conductivity, in accordance with some embodiments. In some embodiments, the first-type conductivity is P-type, and the second-type conductivity is N-type. The second dopants include Group VA elements, such as nitrogen (N) or phosphorus (P), in accordance with some embodiments.

As shown in FIG. 1D, a device 230 is formed in and over the semiconductor substrate 210 in the opening 222, in accordance with some embodiments. In some embodiments, the device 230 includes a transistor. The device 230 includes a gate dielectric layer 232, a gate 234, a spacer layer 236, a source region 238, and a drain region 238, in accordance with some embodiments.

The gate dielectric layer 232 is formed over the semiconductor substrate 210 in the opening 222, in accordance with some embodiments. In some embodiments, the gate dielectric layer 232 includes a high dielectric constant material (high-k material), in accordance with some embodiments. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments.

The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments. The gate 234 is formed over the gate dielectric layer 232, in accordance with some embodiments. The gate 234 is made of polysilicon, metal, or another suitable material, in accordance with some embodiments.

As shown in FIG. 1D, a spacer layer 236 is formed over sidewalls of the gate 234 and the gate dielectric layer 232, in accordance with some embodiments. The spacer layer 236 includes a dielectric material, such as silicon nitride, silicon oxynitride, or a combination thereof, in accordance with some embodiments.

As shown in FIG. 1D, the source region 238 and the drain region 238 are formed in the active regions 214, in accordance with some embodiments. The source region 238 and the drain region 238 are formed on opposite sides of the gate 234, in accordance with some embodiments. The source region 238 and the drain region 238 are formed using an implantation process, in accordance with some embodiments.

The source region 238 includes a heavily doped source region, in accordance with some embodiments. The drain region 238 includes a heavily doped drain region, in accordance with some embodiments. The source region 238 and the drain region 238 are formed after the formation of the spacer layer 236, in accordance with some embodiments.

As shown in FIG. 1D, a dielectric layer 240 is formed over the top surface 211a of the semiconductor substrate 210, in accordance with some embodiments. The dielectric layer 240 covers the device 230 and the isolation structure 220, in accordance with some embodiments. The dielectric layer 240 is a multi-layer structure, in accordance with some embodiments. The dielectric layer 240 includes dielectric layers stacked with each other (not shown), in accordance with some embodiments.

The dielectric layer 240 is made of any suitable dielectric material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 240 is formed by any suitable process, such as a CVD process, HDPCVD process, spin-on process, sputtering process, or a combination thereof, in accordance with some embodiments.

As shown in FIG. 1D, wiring layers 252 and 254 are formed in the dielectric layer 240, in accordance with some embodiments. The wiring layers 252 and 254 are made of any suitable conductive material, such as copper, a copper alloy, silver, gold, aluminum, or a combination thereof. As shown in FIG. 1D, conductive via structures 256 and 258 are formed in the dielectric layer 240, in accordance with some embodiments.

The conductive via structures 256 electrically connect the wiring layer 252 to the gates 234, in accordance with some embodiments. The conductive via structures 258 electrically connect the wiring layer 252 to the wiring layer 254, in accordance with some embodiments. The conductive via structures 256 and 258 are made of any suitable conductive material, such as copper, a copper alloy, silver, gold, aluminum, or a combination thereof.

As shown in FIG. 1D, a passivation layer 260 is formed over the dielectric layer 240, in accordance with some embodiments. The passivation layer 260 is made of any suitable dielectric material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The passivation layer 260 is formed by any suitable process, such as a CVD process, HDPCVD process, spin-on process, sputtering process, or a combination thereof, in accordance with some embodiments.

In some embodiments, a wiring layer 270 is embedded in the passivation layer 260. The wiring layer 270 is exposed by the passivation layer 260, in accordance with some embodiments. The wiring layer 270 is made of any suitable conductive material, such as copper, a copper alloy, silver, gold, aluminum, or a combination thereof.

As shown in FIG. 1D, a conductive via structure 280 is formed in the dielectric layer 240 and the passivation layer 260, in accordance with some embodiments. The conductive via structure 280 electrically connects the wiring layer 254 to the wiring layer 270, in accordance with some embodiments.

The conductive via structure 280 is made of any suitable conductive material, such as copper, a copper alloy, silver, gold, aluminum, or a combination thereof. In some embodiments, the device 230, the dielectric layer 240, the wiring layers 252 and 254, the conductive via structures 256 and 258, the passivation layer 260, the wiring layer 270, and the conductive via structure 280 together form a device layer L2.

As shown in FIG. 1D, the semiconductor substrate 110 is flipped upside down to bond with the substrate 210 through the device layers L1 and L2, in accordance with some embodiments. The wiring layers 170 and 270 are electrically connected with each other, in accordance with some embodiments.

Figure 1E:
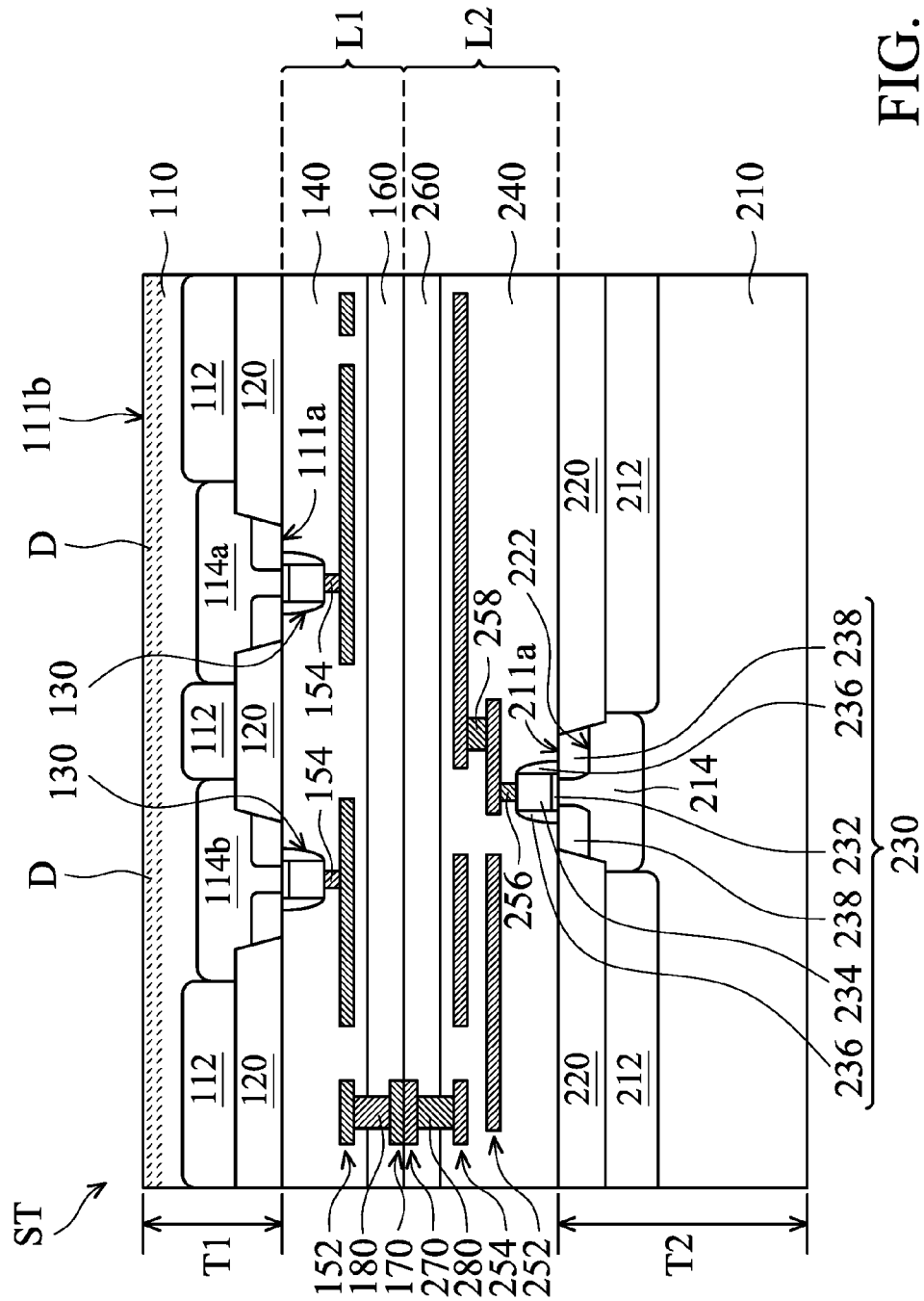

As shown in FIG. 1E, a portion of the semiconductor substrate 110 is removed from the surface 111b of the semiconductor substrate 110, in accordance with some embodiments. The surface 111a is opposite to the surface 111b, in accordance with some embodiments. After the removal process, the semiconductor substrate 110 is thinned down, in accordance with some embodiments. The removal process includes a chemical mechanical polishing process, in accordance with some embodiments.

After the removal process, a thickness T1 of the semiconductor substrate 110 is less than a thickness T2 of the substrate 210, in accordance with some embodiments. A ratio of the thickness T1 of the semiconductor substrate 110 to the thickness T2 of the substrate 210 ranges from about 0.01 to about 0.001, in accordance with some embodiments. Therefore, the stack structure ST, which includes the semiconductor substrate 110 and the substrate 210, has a thickness that is close to the thickness T2, in accordance with some embodiments. As a result, the removal process reduces the thickness of the stack structure ST to a suitable thickness, in accordance with some embodiments.

The removal process may cause defects D in a top portion of the semiconductor substrate 110 adjacent to the surface 111b, in accordance with some embodiments. The defects D include physical defects (e.g., scratch defects), electrical defects (e.g., dangling bonds of the elements constituting the semiconductor substrate 110), or the like, in accordance with some embodiments. The defects D may trap carriers (e.g., electrons) and result in a leakage current in the semiconductor substrate 110.

Figure 1F:
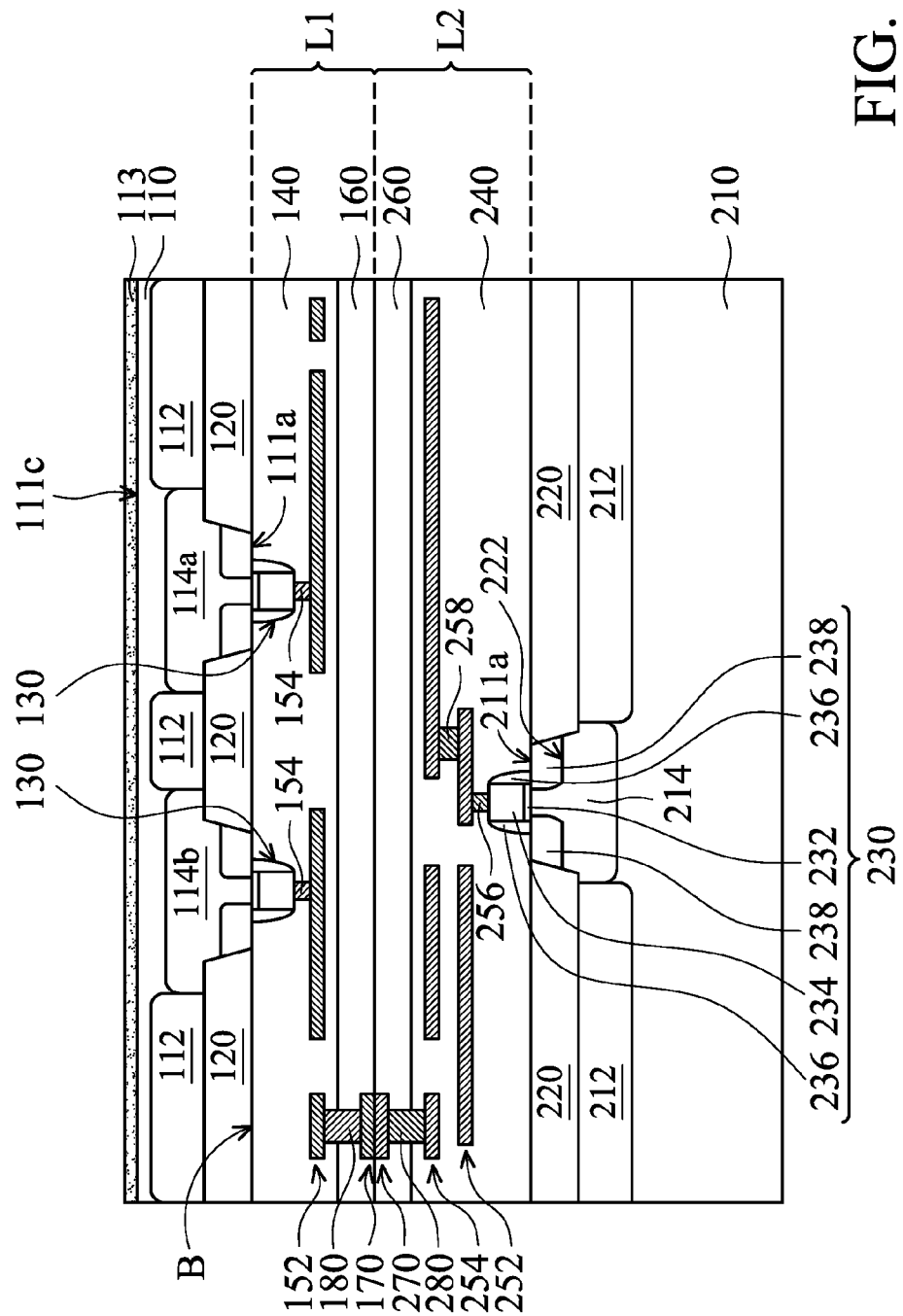

As shown in FIG. 1F, an implantation process is performed to implant third dopants into the top portion of the semiconductor substrate 110, in accordance with some embodiments. The third dopants have the same type of conductivity as the first dopants in the semiconductor substrate 110 to neutralize the carriers (e.g., electrons) trapped by the defects D, in accordance with some embodiments.

Therefore, the third dopants have the first-type conductivity, in accordance with some embodiments. In some embodiments, the first-type conductivity is P-type. The third dopants include Group IIIA elements, such as boron (B) or aluminum (Al), in accordance with some embodiments. In some embodiments, the first dopants and the third dopants are made of the same material. In some embodiments, a doping concentration of the third dopants in the top portion of the semiconductor substrate 110 is greater than a doping concentration of the first dopants in the semiconductor substrate 110.

After the implantation process, an annealing process is performed on the top portion of the semiconductor substrate 110, in accordance with some embodiments. The annealing process causes the top portion of the semiconductor substrate 110 to melt and to recrystallize, in accordance with some embodiments. The annealing process activates the third dopants and repairs the defects D in the top portion, in accordance with some embodiments. The third dopants may bond with the dangling bonds of the elements constituting the semiconductor substrate 110.

Therefore, the implantation process and the annealing process are able to repair the defects D so as to decrease the leakage current in the semiconductor substrate 110. As a result, the yield of the semiconductor substrate 110 is improved, in accordance with some embodiments.

The top portion of the substrate 110 is melted and recrystallized to form a doped layer 113, in accordance with some embodiments. In some embodiments, a first doping concentration of the third dopants in the doped layer 113 is greater than a second doping concentration of the first dopants in the semiconductor substrate 110.

The ratio of the first doping concentration of the third dopants to the second doping concentration of the first dopants ranges from about 10 to about $10^6$, in accordance with some embodiments. The doped layer 113 is also referred to as a heavily doped layer, in accordance with some embodiments. The doped layer 113 covers the active regions 114a and 114b and/or the isolation doped regions 112, in accordance with some embodiments.

The doped layer 113 is formed over the surface 111c of the semiconductor substrate 110, in accordance with some embodiments. The surface 111c is opposite to the surface 111a, in accordance with some embodiments. The doped layer 113 covers the entire surface 111c, in accordance with some embodiments. The doped layer 113 is a continuous film, in accordance with some embodiments. The doped layer 113 covers a portion of the surface 111c, in accordance with some embodiments.

Figure 1G:
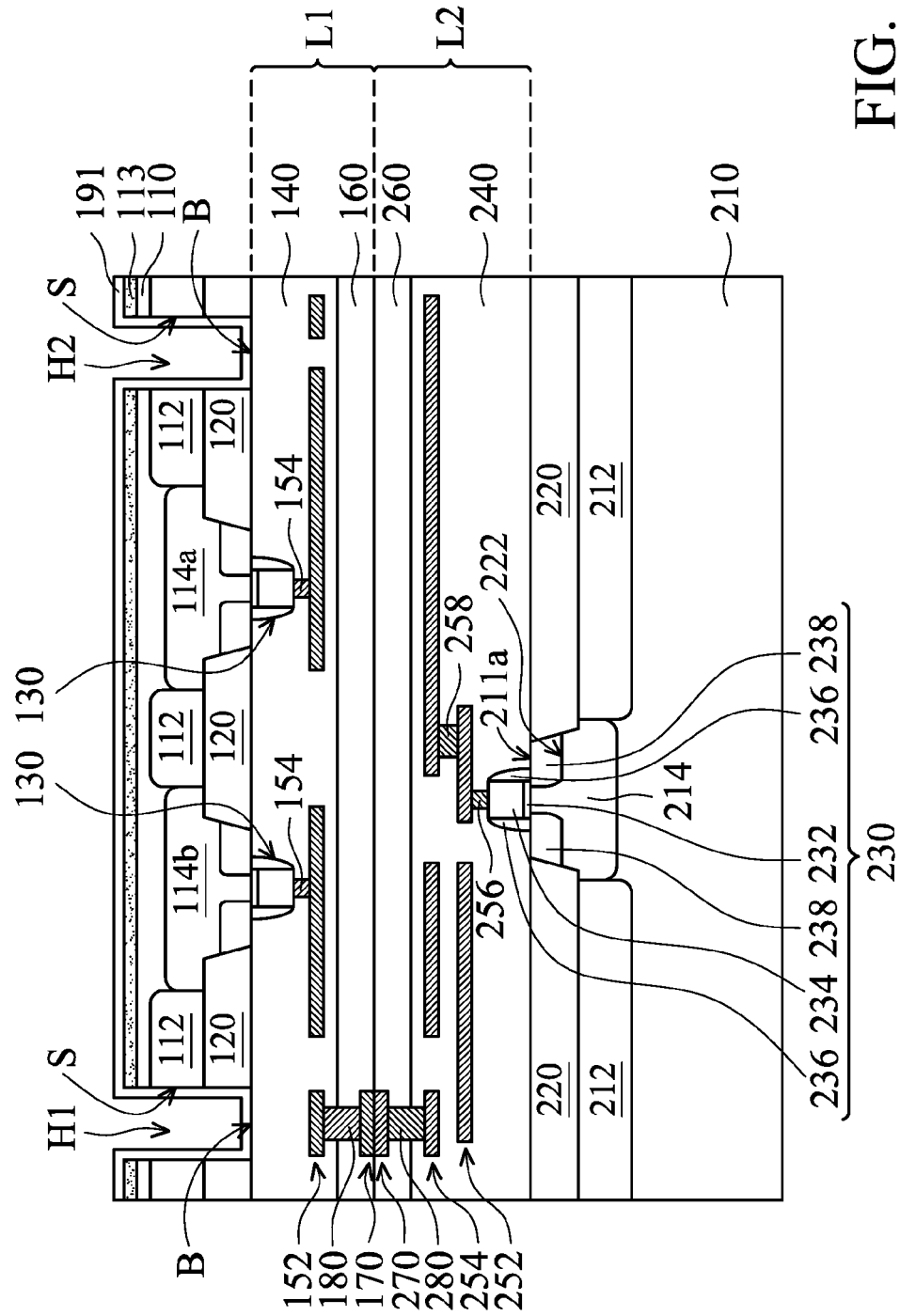

As shown in FIG. 1G, portions of the doped layer 113, the semiconductor substrate 110, and the isolation structure 120 are removed, in accordance with some embodiments. After the removal process, through holes H1 and H2 are formed, in accordance with some embodiments. Each of the through holes H1 or H2 passes through the doped layer 113, the semiconductor substrate 110, and the isolation structure 120 and exposes a portion of the dielectric layer 140, in accordance with some embodiments. The removal process includes a photolithography process and an etching process, in accordance with some embodiments.

As shown in FIG. 1G, an insulating layer 191 is formed over the doped layer 113 and the sidewalls S and the bottom surfaces B of the through holes H1 and H2, in accordance with some embodiments. The insulating layer 191 is made of any suitable insulating material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The insulating layer 191 is formed by a chemical vapor deposition process or another suitable process.

Figure 1H:
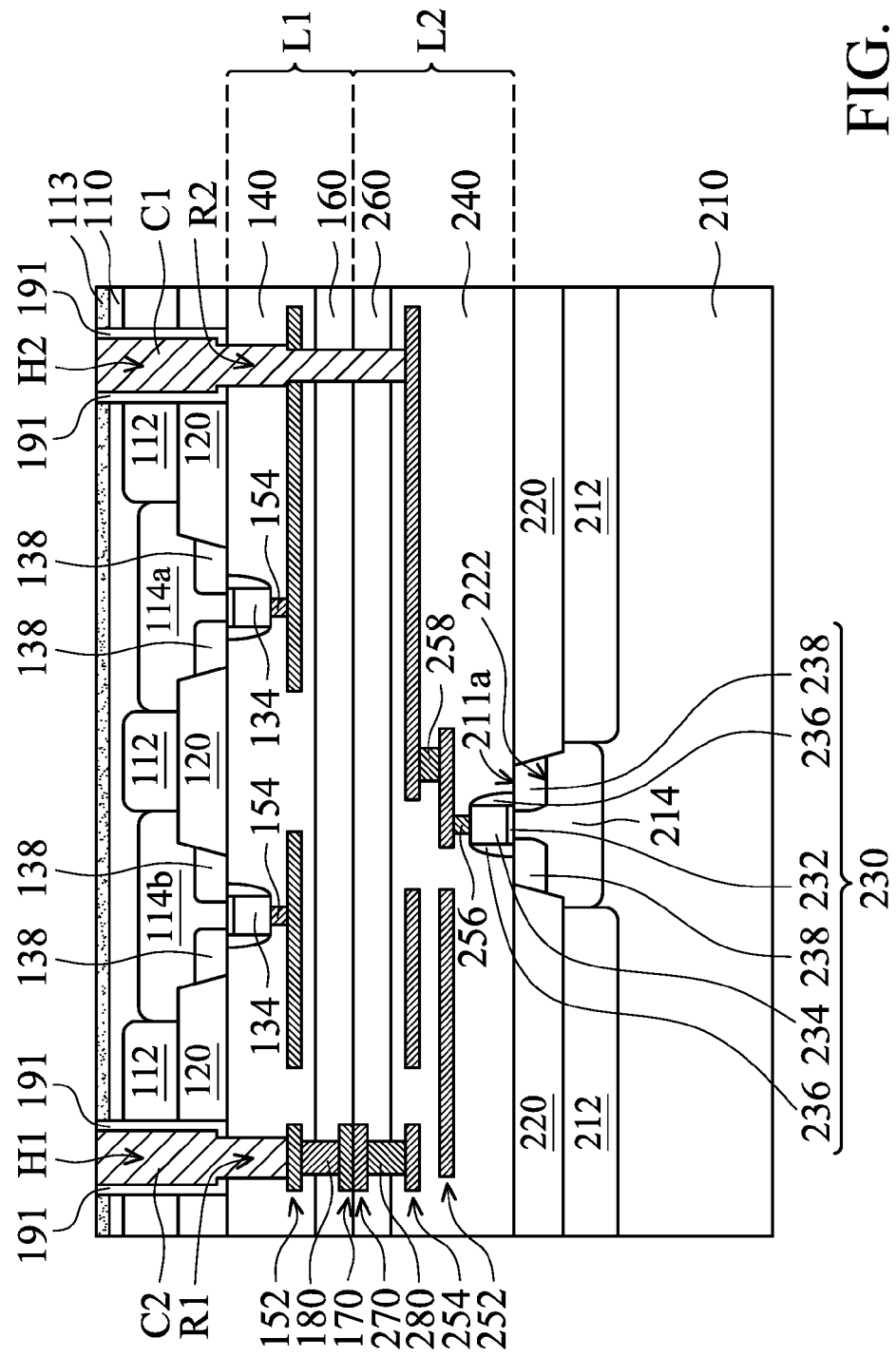

As shown in FIG. 1H, portions of the insulating layer 191, the dielectric layers 140 and 240, and the passivation layer 160 and 260 are removed, in accordance with some embodiments. After the removal process, recesses R1 and R2 are formed, in accordance with some embodiments. The recess R1 passes through the insulating layer 191 and penetrates into the dielectric layer 140 to expose a portion of the wiring layer 152, in accordance with some embodiments.

The recess R2 passes through the insulating layer 191, the dielectric layer 140, the passivation layer 160 and 260 and penetrates into the dielectric layer 240 to expose portions of the wiring layer 152 and 254, in accordance with some embodiments. The removal process includes a photolithography process and an etching process, in accordance with some embodiments.

Thereafter, a conductive layer (not shown) is formed over the insulating layer 191 and in the recesses R1 and R2 and the through holes H1 or H2, in accordance with some embodiments. Afterwards, portions of the insulating layer 191 and the conductive layer outside of the recesses R1 and R2 and the through holes H1 or H2 are removed, in accordance with some embodiments. The removal process includes a chemical mechanical polishing process, in accordance with some embodiments.

The conductive layer remaining in the recess R1 and the through hole H1 forms a conductive structure C2, in accordance with some embodiments. The conductive layer remaining in the recess R2 and the through hole H2 forms a conductive structure C1, in accordance with some embodiments. The conductive structures C1 and C2 are also referred to as conductive plugs, in accordance with some embodiments.

The conductive structure C1 passes through the doped layer 113, the semiconductor substrate 110, the isolation structure 120, the dielectric layer 140, the passivation layer 160 and 260 and penetrates into the dielectric layer 240, in accordance with some embodiments. The conductive structure C1 is electrically connected to the wiring layers 152, 252, and 254, the conductive via structures 154, 258, and 256, and the gates 134 and 234, in accordance with some embodiments.

The conductive structure C2 passes through the doped layer 113, the semiconductor substrate 110, and the isolation structure 120 and penetrates into the dielectric layer 140, in accordance with some embodiments. The conductive structure C2 is electrically connected to the wiring layer 152, in accordance with some embodiments. The conductive structures C1 and C2 are electrically isolated from the doped layer 113 and the semiconductor substrate 110 by the insulating layer 191, in accordance with some embodiments.

Figure 1I:
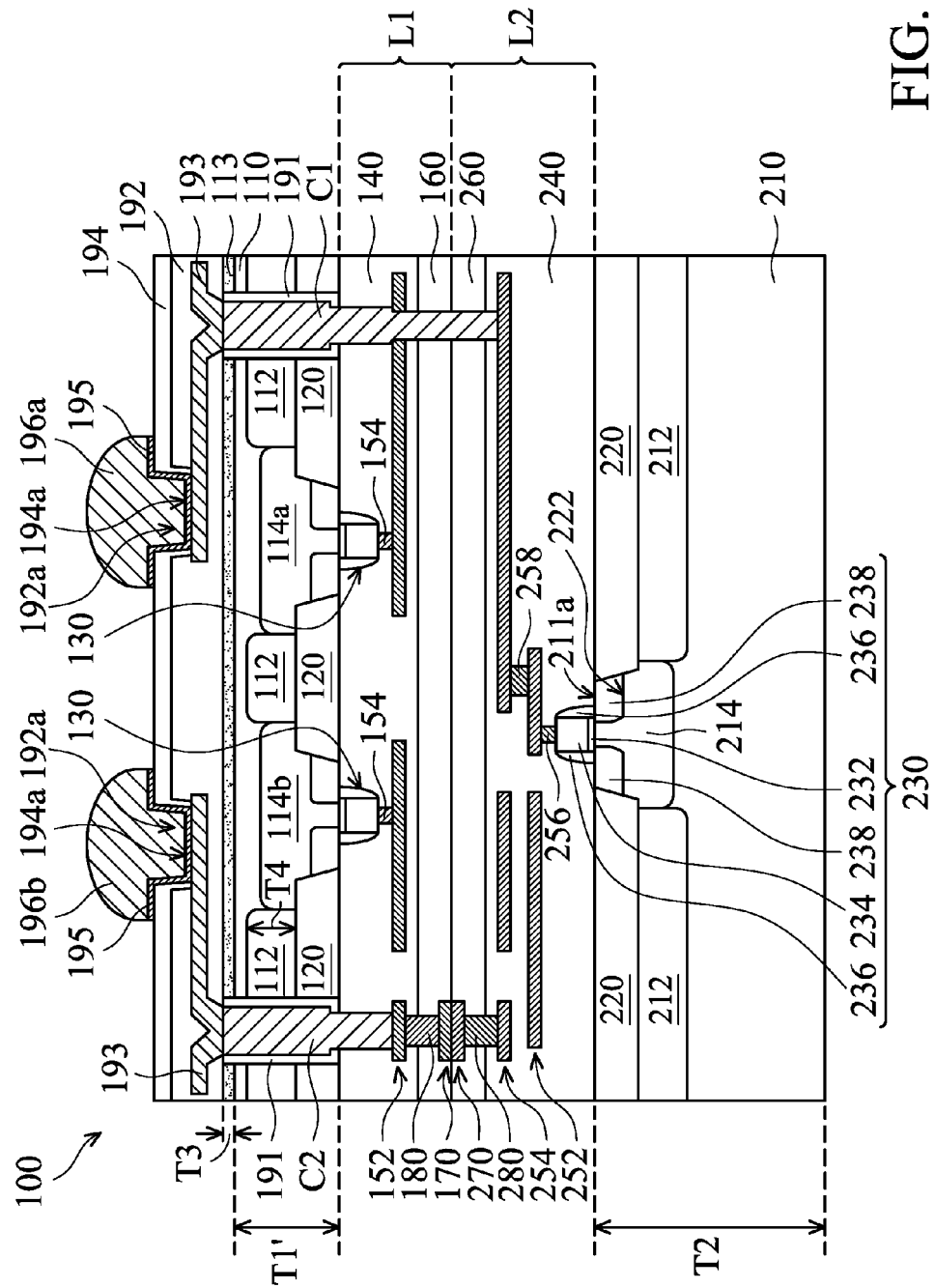

As shown in FIG. 1I, a passivation layer 192 is formed over the doped layer 113, the insulating layer 191, and the conductive structures C1 and C2, in accordance with some embodiments. The passivation layer 192 is made of any suitable dielectric material, such as silicon oxynitride or silicon oxide. As shown in FIG. 1I, a redistribution layer 193 is formed in the passivation layer 192 to electrically connected to the conductive structures C1 and C2, in accordance with some embodiments. The passivation layer 192 has openings 192a exposing portions of the redistribution layer 193, in accordance with some embodiments.

As shown in FIG. 1I, a passivation layer 194 is formed over the passivation layer 192 and the redistribution layer 193, in accordance with some embodiments. The passivation layer 194 has openings 194a exposing the portions of the redistribution layer 193, in accordance with some embodiments. The passivation layer 194 is made of any suitable dielectric material, such as silicon oxynitride or silicon oxide.

As shown in FIG. 1I, under bump metallization (UBM) layers 195 are formed over the sidewalls and bottoms of the openings 194a to be electrically connected to the redistribution layer 193, in accordance with some embodiments. In some embodiments, the UBM layers 195 include chromium (Cr), copper (Cu), gold (Au), titanium (Ti), tungsten (W), another suitable material, or a combination thereof.

As shown in FIG. 1I, conductive bumps 196a and 196b are formed to fill the openings 194a in the passivation layer 194, in accordance with some embodiments. Each of the conductive bumps 196a and 196b is electrically connected to the corresponding UBM layer 195 and the redistribution layer 193, in accordance with some embodiments. The conductive bump 196a is above the active region 114a, in accordance with some embodiments.

The conductive bump 196b is above the active region 114b, in accordance with some embodiments. The conductive bump 196a and 196b cover portions of the active regions 114a and 114b, respectively, in accordance with some embodiments. The conductive bumps 196a and 196b are made of an opaque conductive material, such as alloy or metal, in accordance with some embodiments. In some embodiments, the conductive bumps 196a and 196b are solder bumps. In this step, a semiconductor device structure 100 is formed, in accordance with some embodiments.

A thickness T1' of the semiconductor substrate 110 is less than the thickness T2 of the substrate 210, in accordance with some embodiments. A ratio of the thickness T1' of the semiconductor substrate 110 to the thickness T2 of the substrate 210 ranges from about 0.01 to about 0.001, in accordance with some embodiments. A thickness T3 of the doped layer 113 is less than a thickness T4 of the isolation doped region 112, in accordance with some embodiments.

In some other embodiments, the first-type conductivity is N-type, and the second-type conductivity is P-type. The first dopants include Group VA elements, such as nitrogen (N) or phosphorus (P), in accordance with some embodiments. The second dopants include Group IIIA elements, such as boron (B) or aluminum (Al), in accordance with some embodiments. The third dopants have the N-type conductivity, and the third dopants include Group VA elements, such as nitrogen (N) or phosphorus (P), in accordance with some embodiments.

Figures 1, 1I:
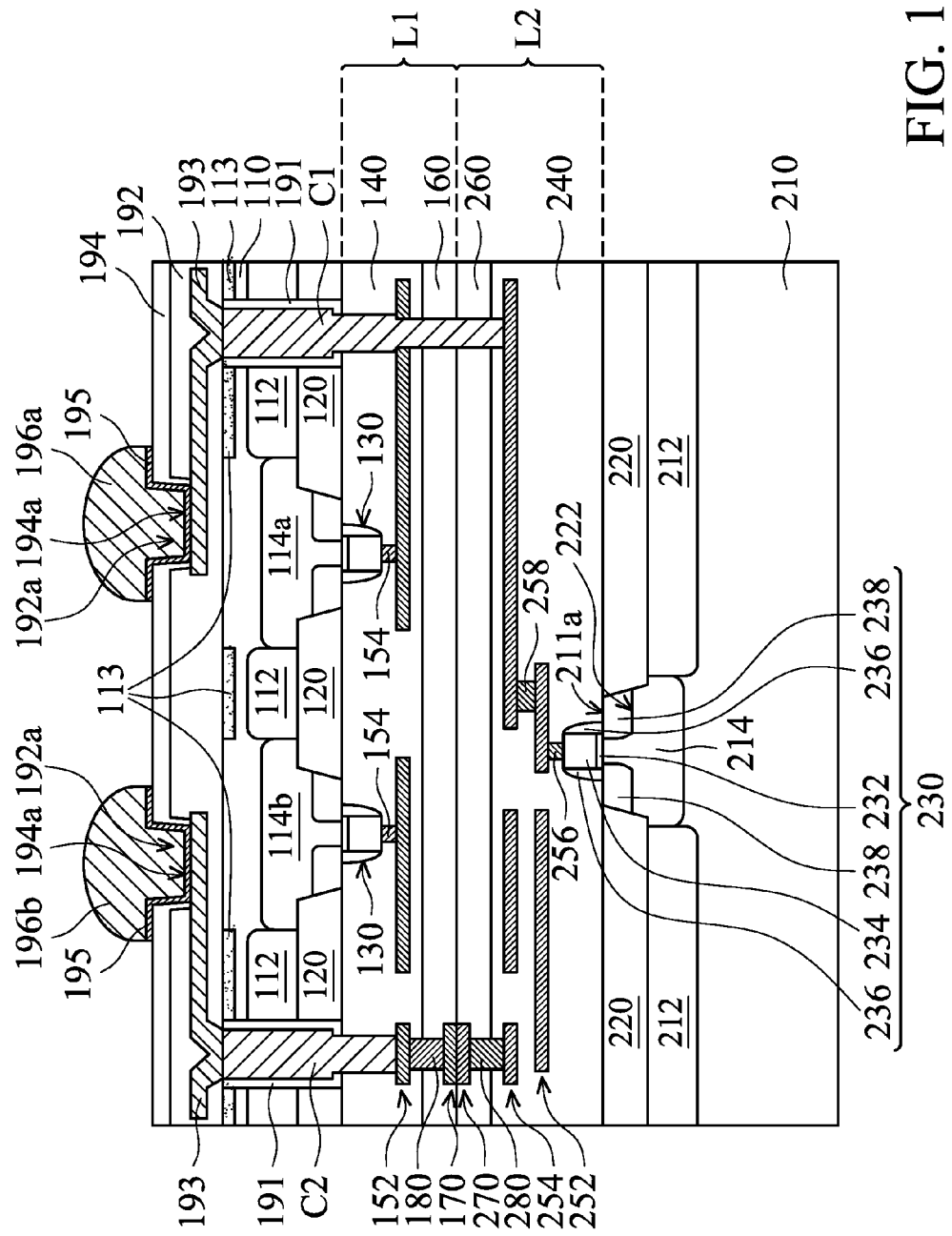

In some other embodiments, the doped layer 113 exposes portions of the active regions 114a and 114b and the isolation doped regions 112. For example, the doped layer 113 covers only the isolation doped regions 112 (as shown in FIG. 1I-1), only the active regions 114a and 114b (as shown in FIG. 1I-2), or only the active region 114b and the isolation doped regions 112 adjacent to the active region 114b (as shown in FIG. 1I-3).

Figures 1, 1I, 2:
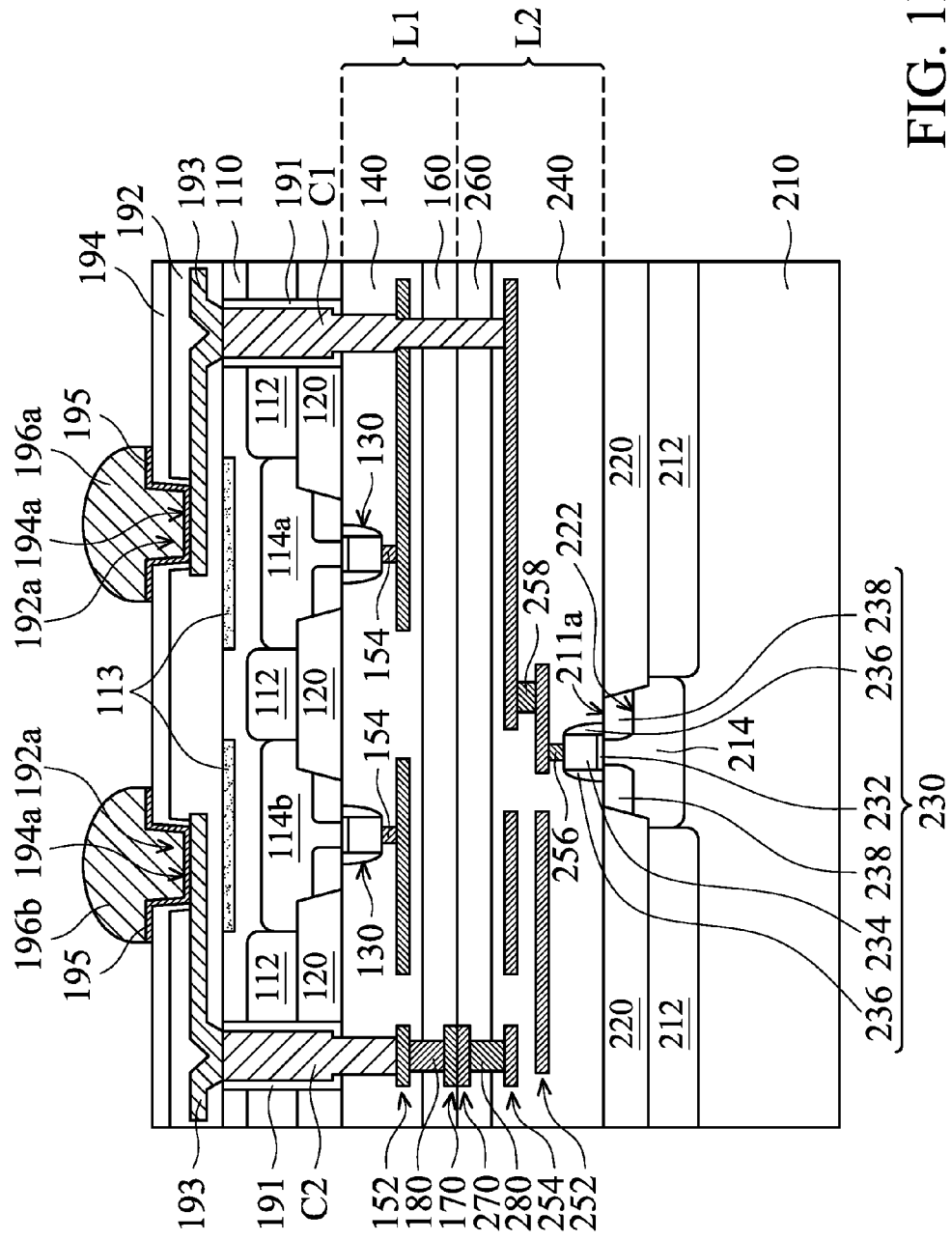

FIG. 2 is a cross-sectional view of a semiconductor device structure, in accordance with some embodiments. As shown in FIG. 2, a semiconductor device structure 200 is similar to the semiconductor device structure 100 in FIG. 1I, except that the conductive structures C1 and C2 are electrically connected to heavily doped regions 114a' and 114b', respectively, in accordance with some embodiments. The heavily doped regions 114a' and 114b' are formed in the active regions 114a and 114b, respectively, in accordance with some embodiments.

The heavily doped regions 114a' and 114b' are doped with second dopants (not shown), in accordance with some embodiments. The second dopants have a second-type conductivity, in accordance with some embodiments. The heavily doped regions 114a' and 114b' and the active regions 114a and 114b are doped with dopants with the same type of conductivity, in accordance with some embodiments.

The doping concentration of the heavily doped regions 114a' and 114b' is greater than that of the active regions 114a and 114b, in accordance with some embodiments. The leakage current and the short circuit are measurable by applying an electrical voltage difference between the heavily doped regions 114a' and 114b' (or the active regions 114a and 114b) through the conductive structures C1 and C2, in accordance with some embodiments.

Figures 1, 1I, 2, 3:
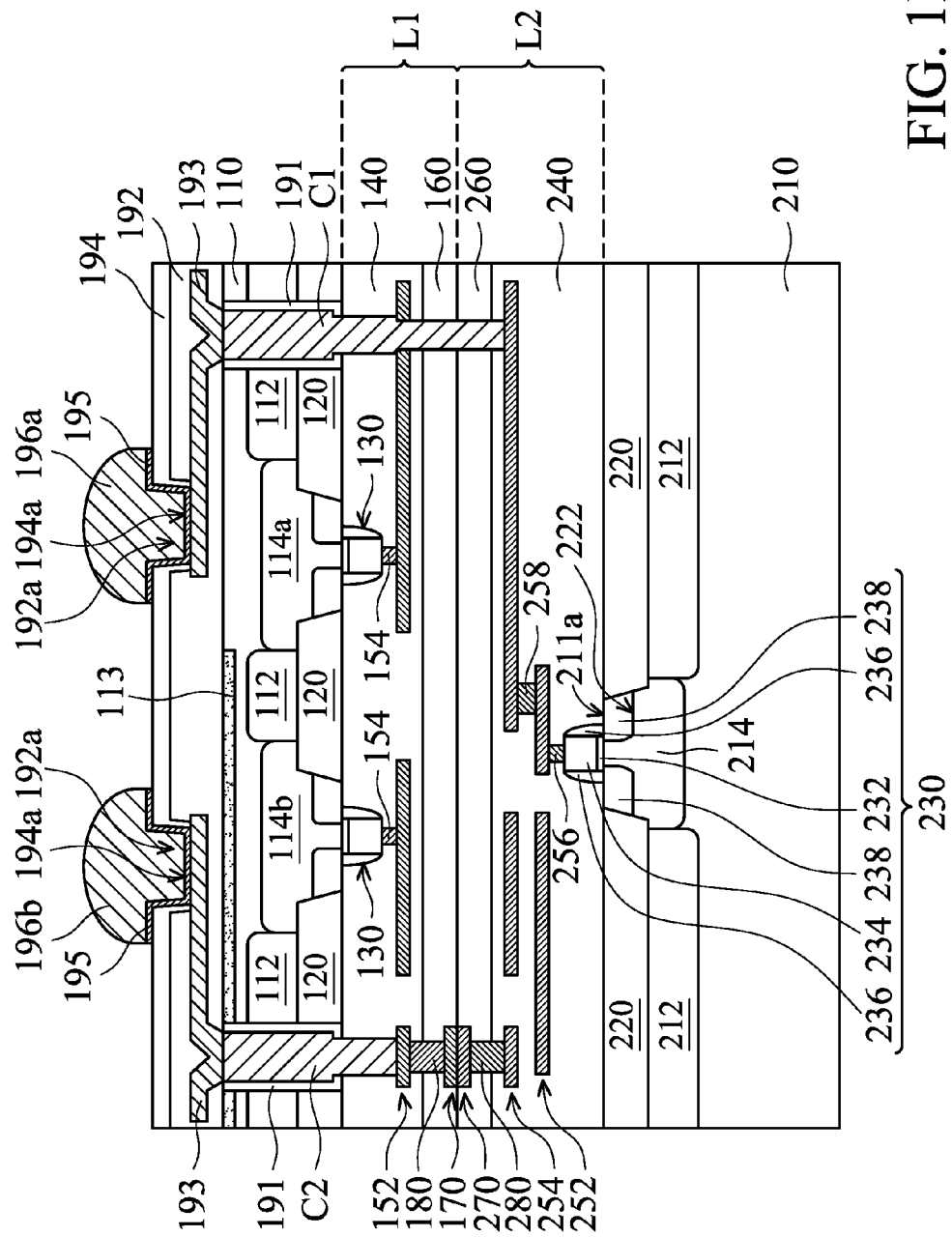
Figure 2:
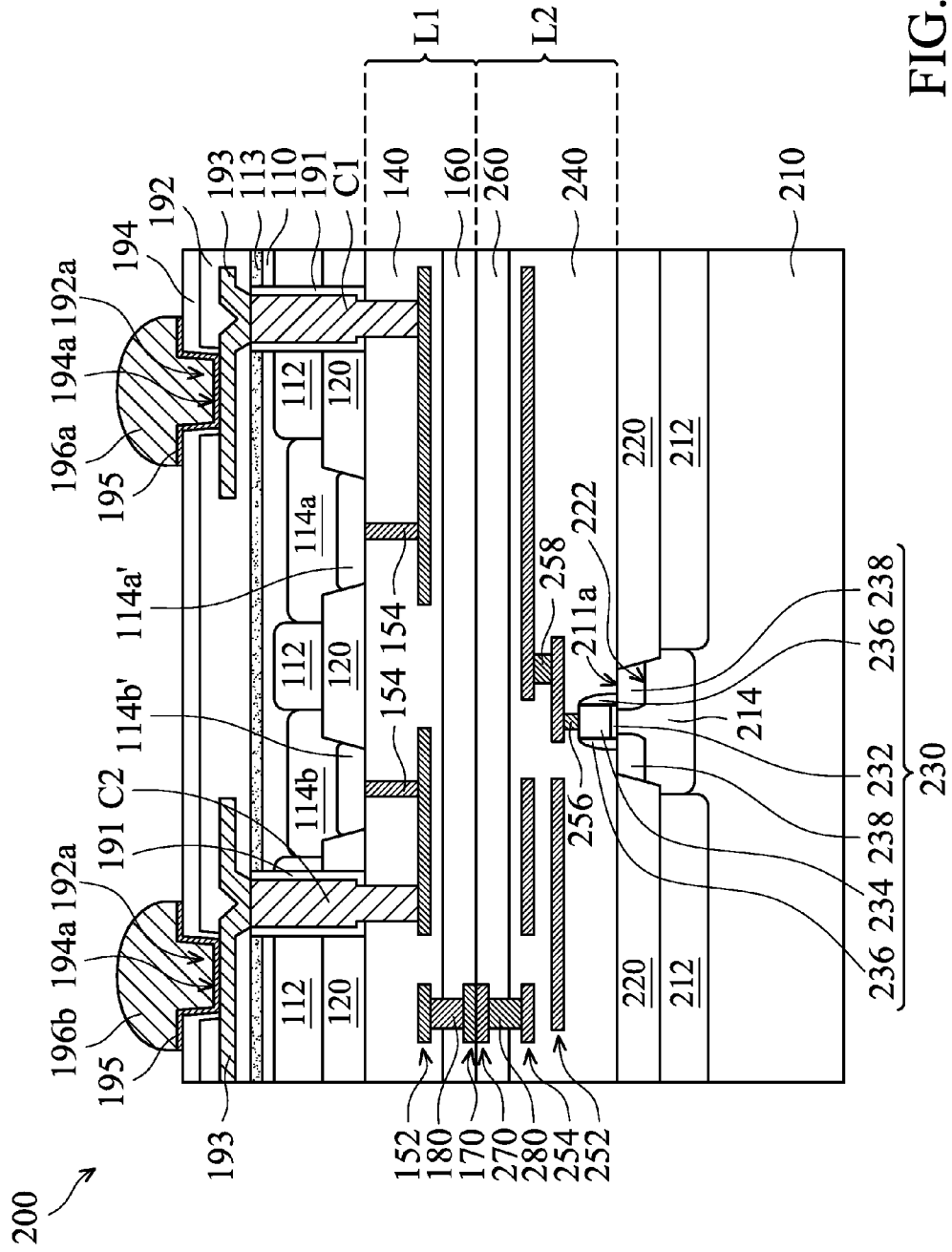
Figure 3A:
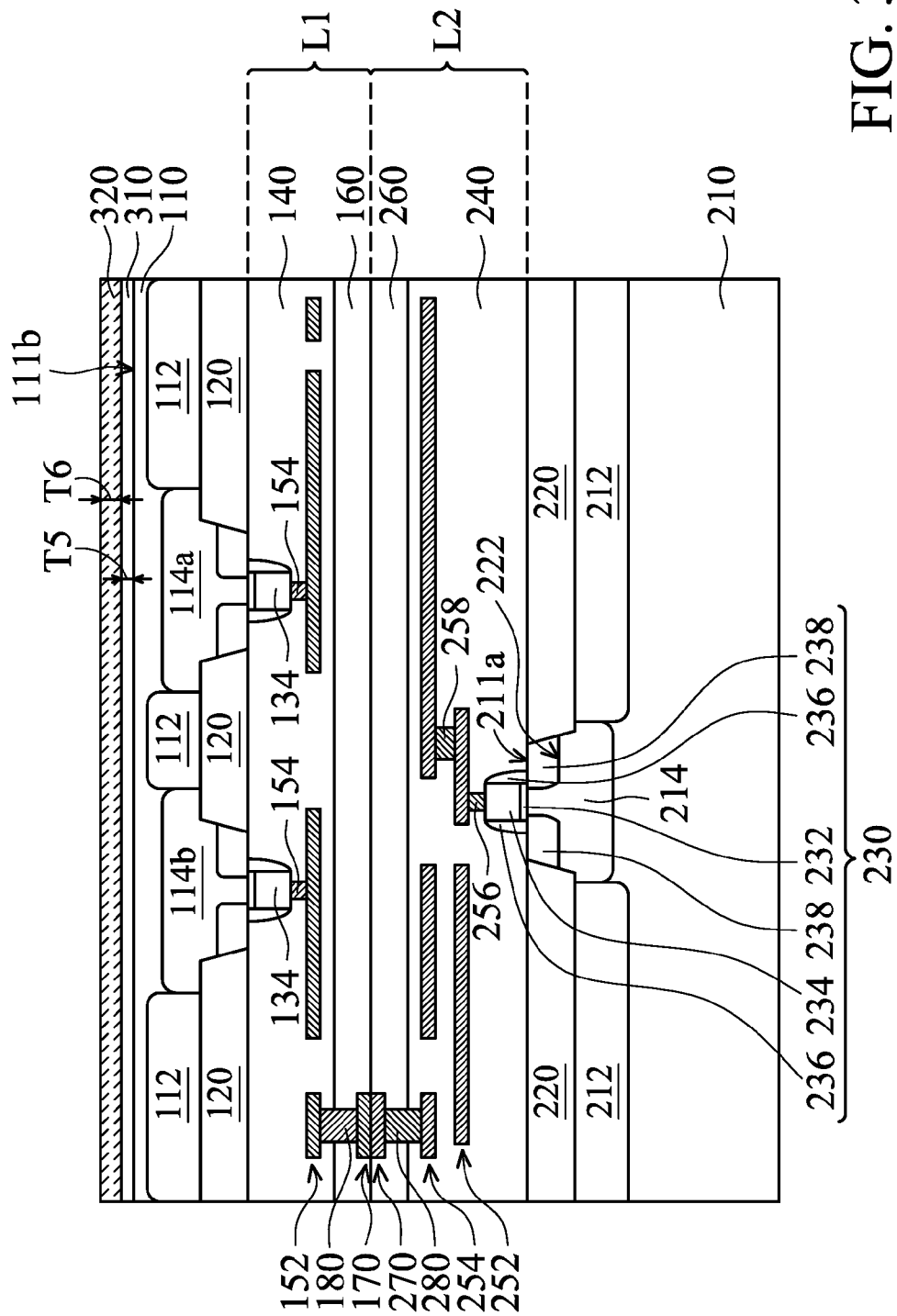
FIGS. 3A-3E are cross-sectional views of various stages of a process for forming a semiconductor device structure, in accordance with some embodiments.
Figure 3B:
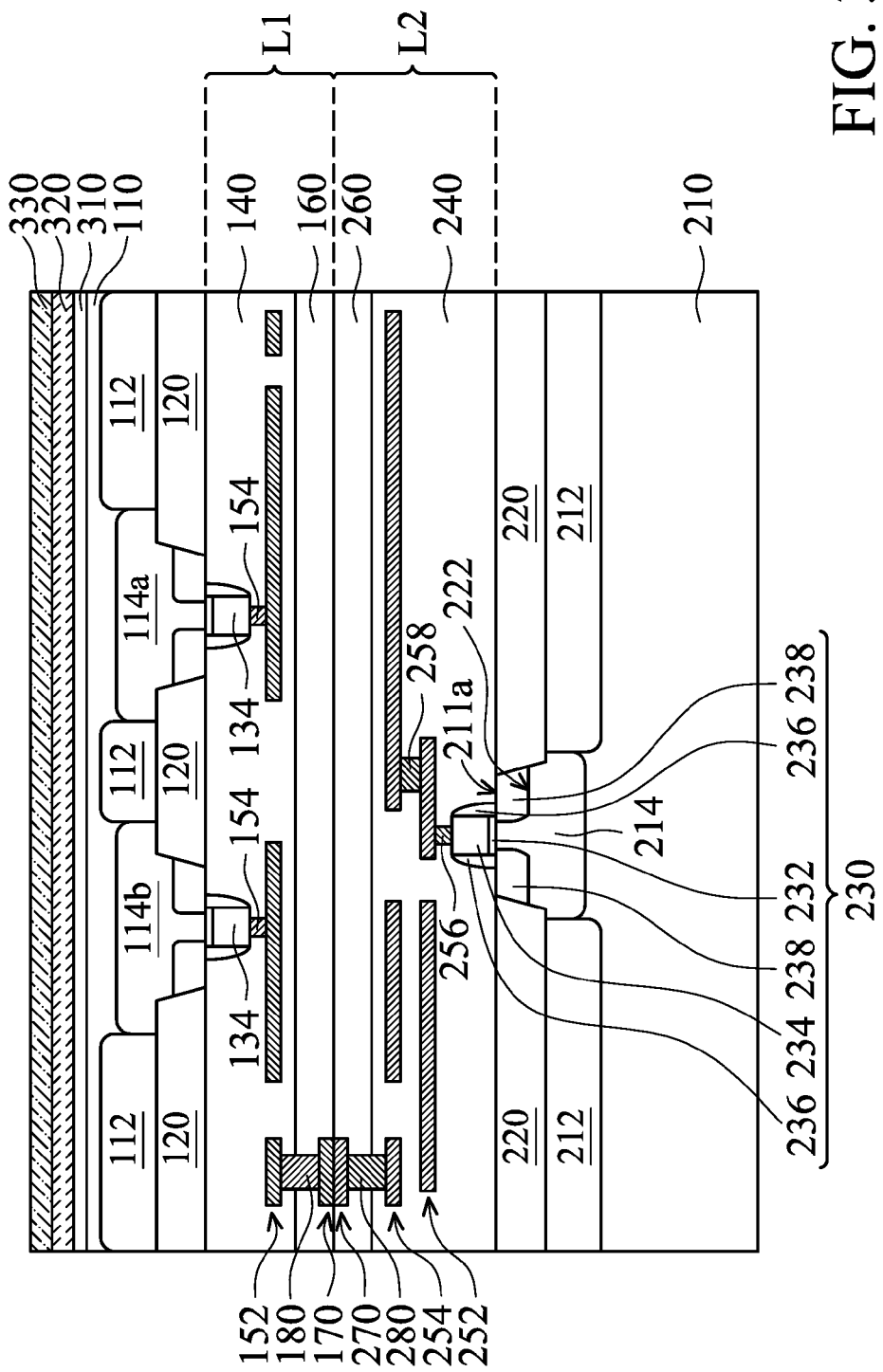
Figure 3C:
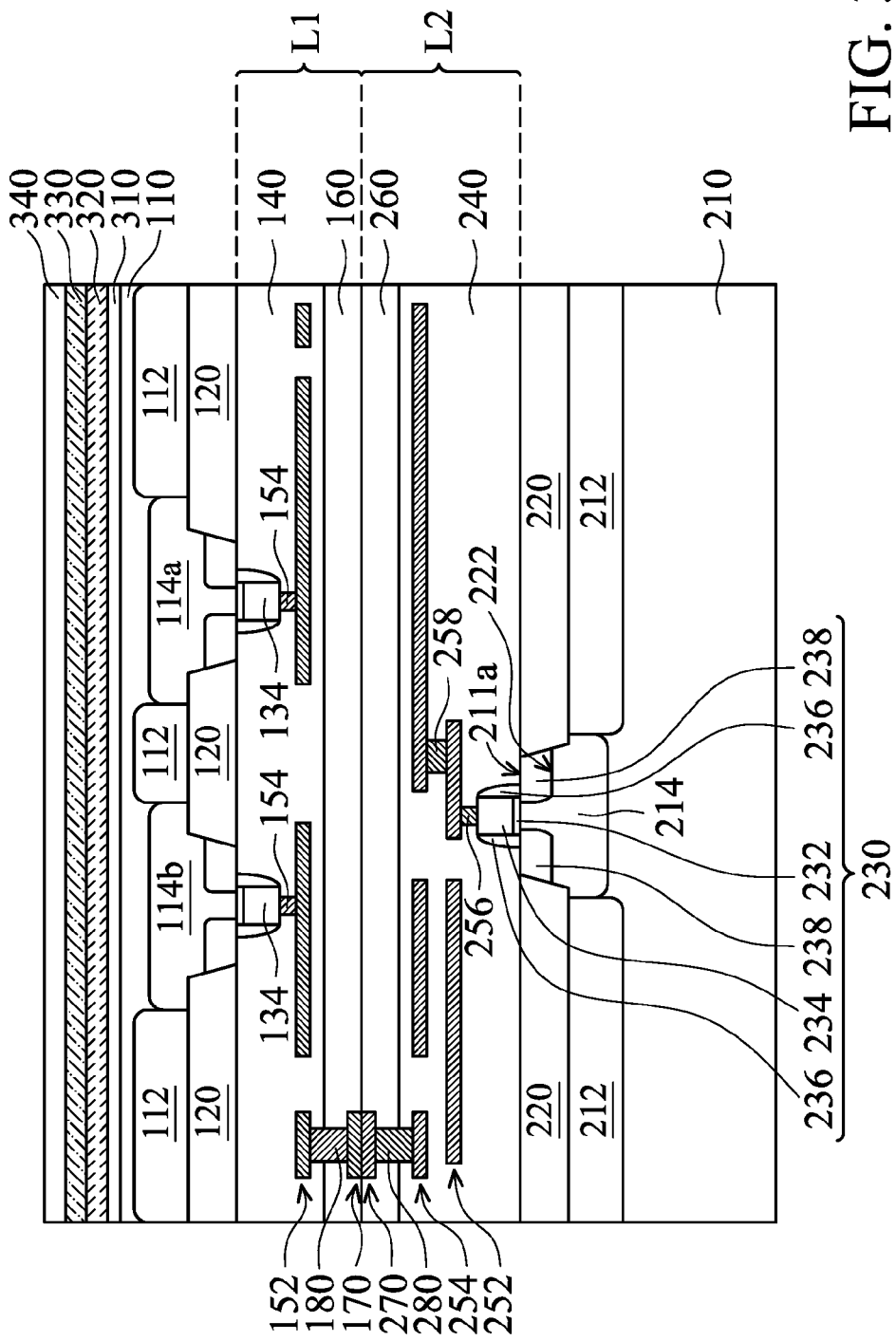
Figure 3D:
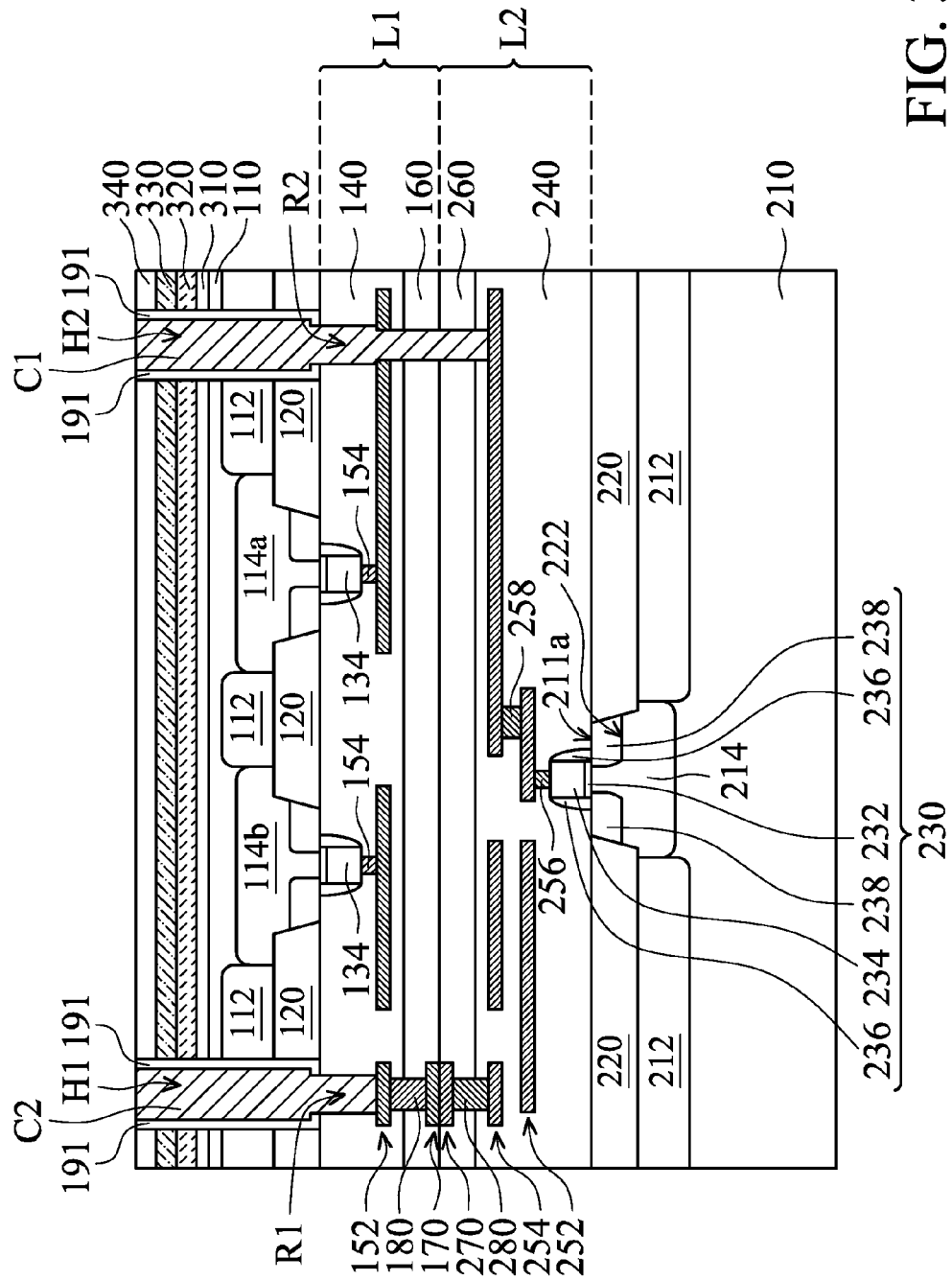
Figure 3E:
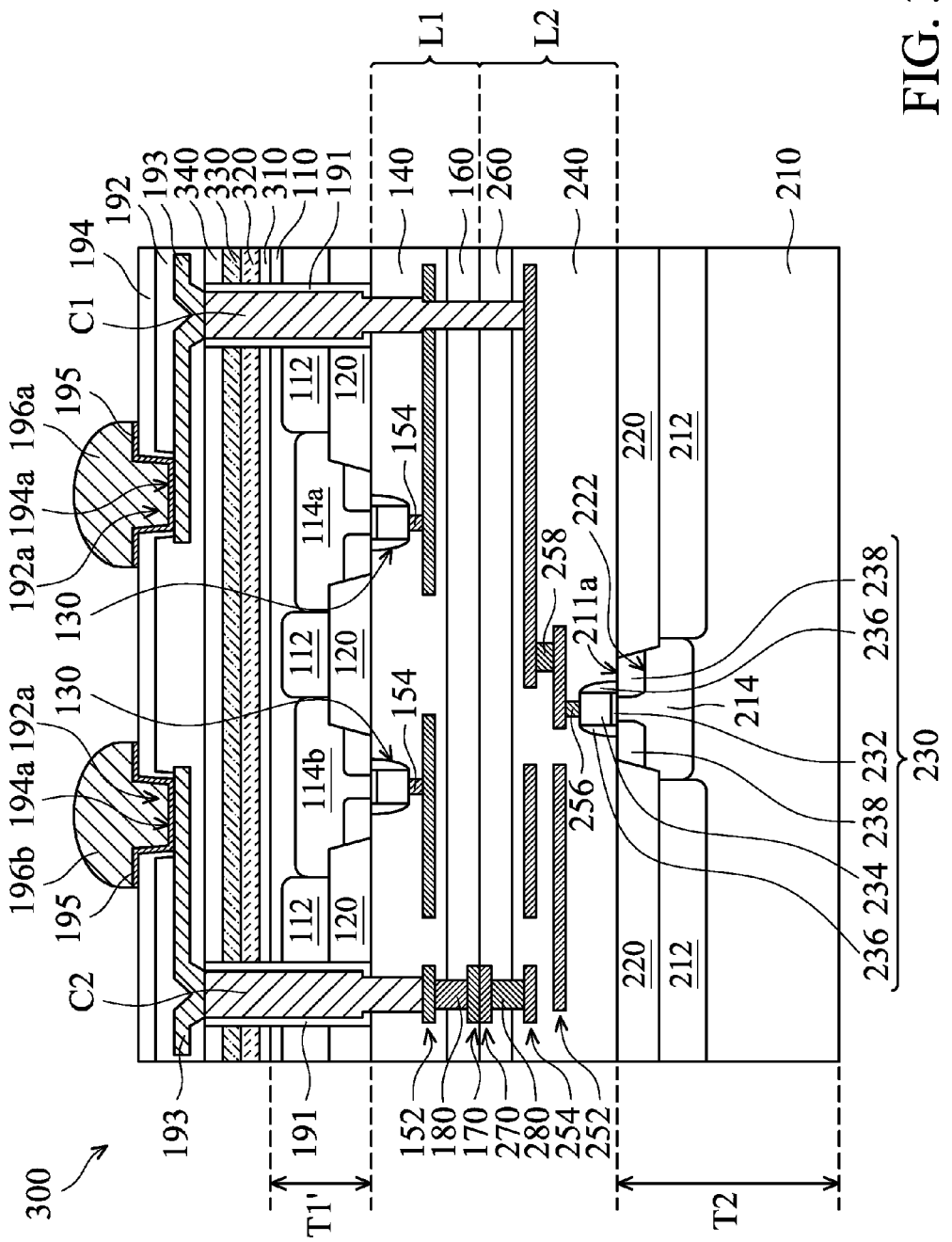
Figures 1, 3E:
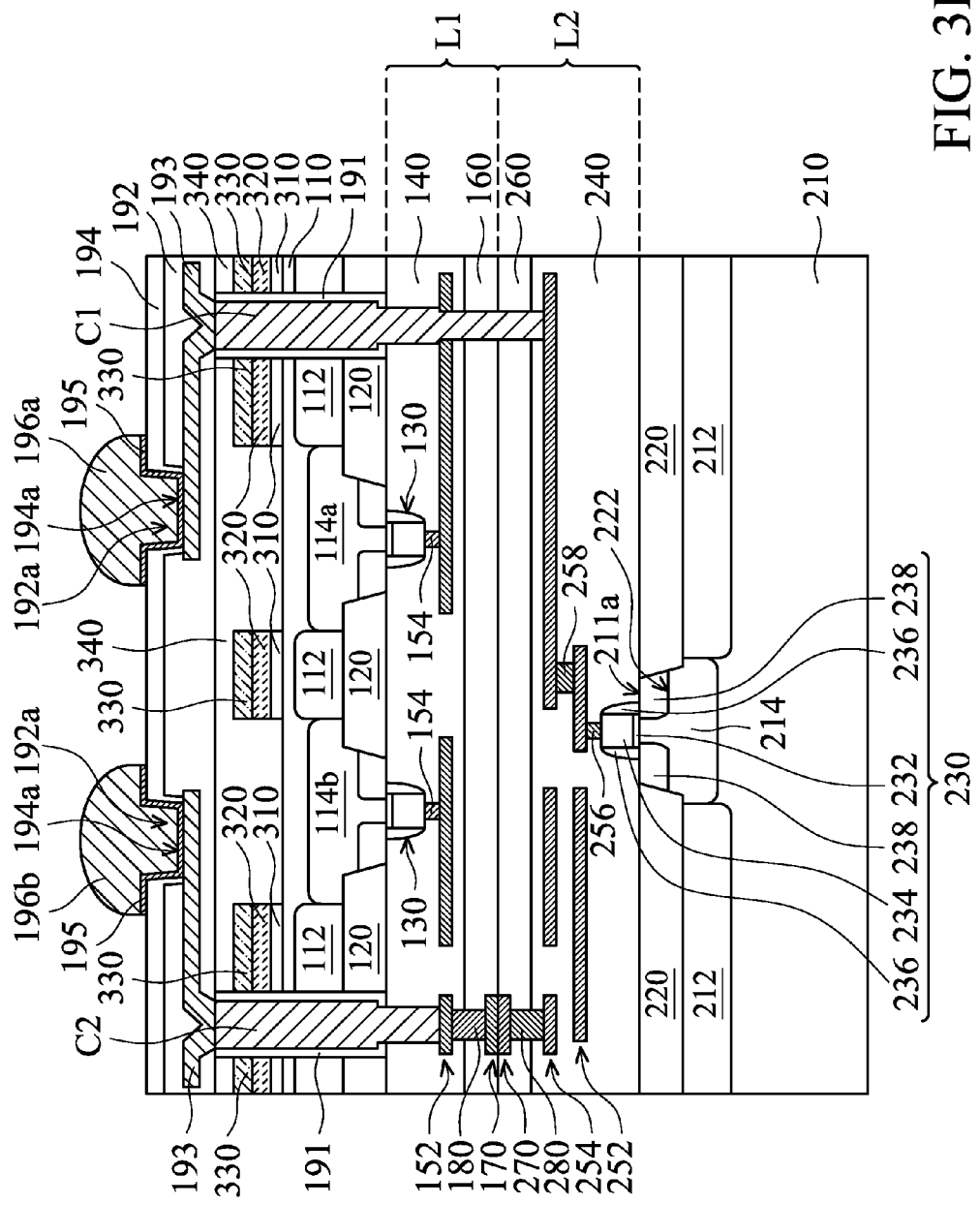
Figures 2, 3E:
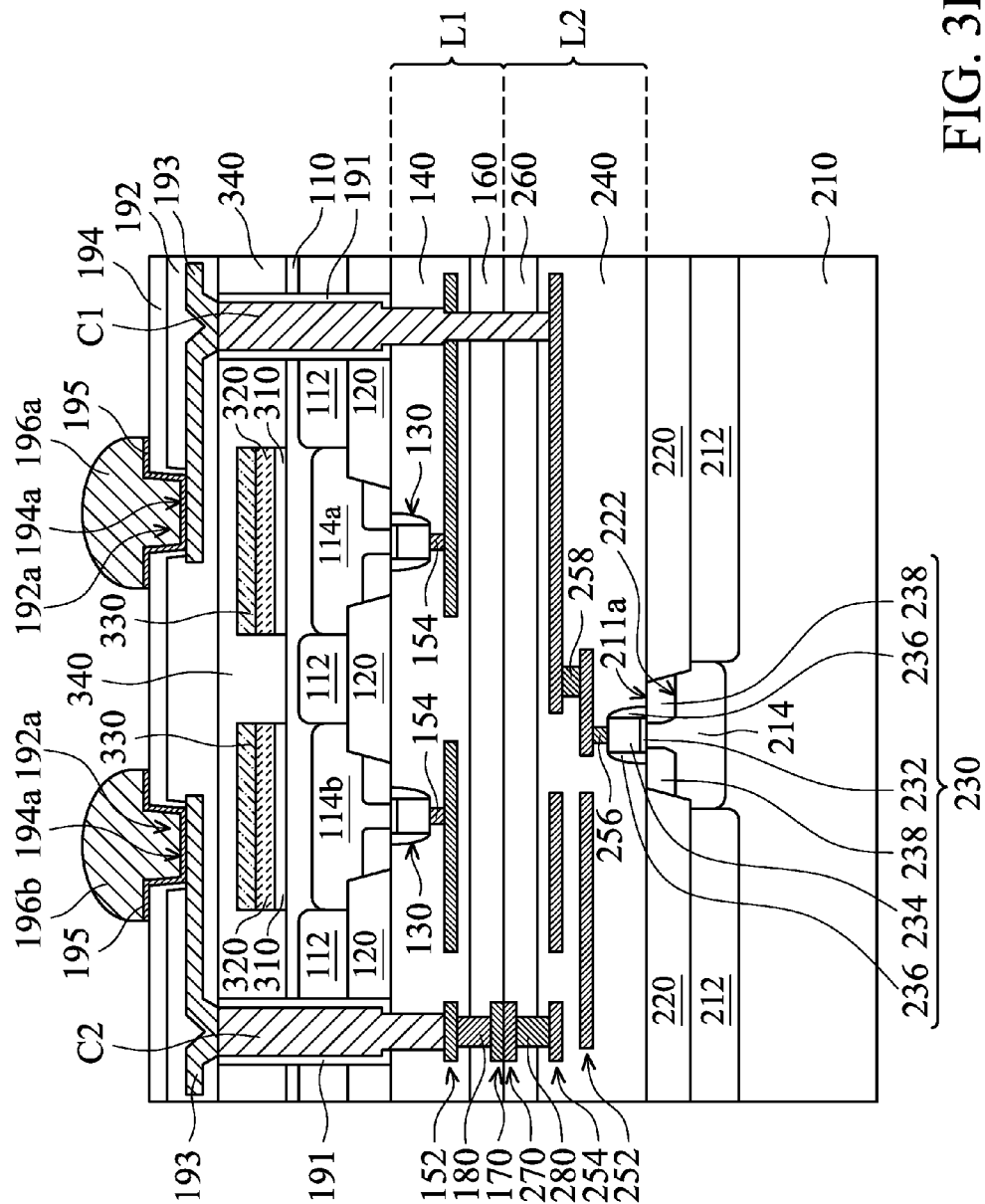
Figures 3, 3E:
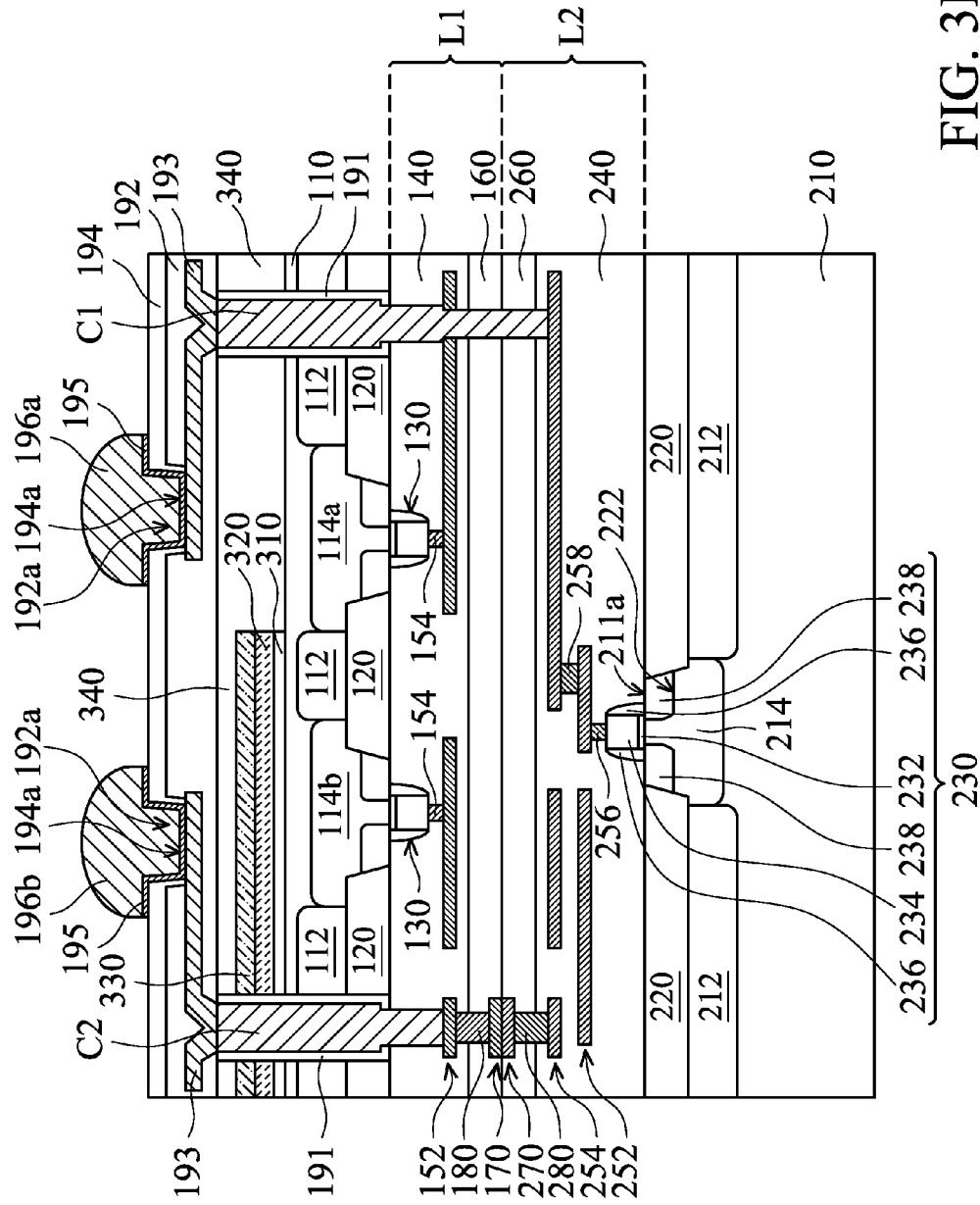

FIGS. 3A-3E are cross-sectional views of various stages of a process for forming a semiconductor device structure, in accordance with some embodiments. FIGS. 3E-1 to 3E-3 are cross-sectional views of variations of the semiconductor device structure 300 of FIG. 3E, in accordance with some embodiments.

As shown in FIG. 3A, after the step of FIG. 1E, an oxide layer 310 is formed over the surface 111b of the semiconductor substrate 110, in accordance with some embodiments. The oxide layer 310 includes silicon oxide or another suitable material. The formation of the oxide layer 310 includes a thermal oxidation process or another suitable process. The formation of the oxide layer 310 may repair the defects D (as shown in FIG. 1E).

As shown in FIG. 3A, a charged layer 320 is formed over the oxide layer 310, in accordance with some embodiments. The charged layer 320 covers the active regions 114a and 114b and/or the isolation doped regions 112, in accordance with some embodiments. The charged layer 320 covers the entire surface 111b, in accordance with some embodiments. The charged layer 320 is a continuous layer, in accordance with some embodiments. The charged layer 320 covers a portion of the surface 111b, in accordance with some embodiments.

The oxide layer 310 is between the charged layer 320 and the semiconductor substrate 110, in accordance with some embodiments. The thickness T5 of the oxide layer 310 is less than the thickness T6 of the charged layer 320, in accordance with some embodiments. In some embodiments, when the first-type conductivity is P-type (i.e., the second-type conductivity is N-type), the charged layer 320 is a negative charged layer.

Therefore, the charged layer 320 induces positive carriers (e.g., electron holes) in the semiconductor substrate 110 to neutralize the negative carriers (e.g., electrons) trapped by the defects D so as to prevent current leakage in the semiconductor substrate 110, in accordance with some embodiments.

The charged layer 320 (or the negative charged layer) includes a high-k material, in accordance with some embodiments. The charged layer 320 (or the negative charged layer) includes $HfO_2$, $Al_2O_3$, or $Ta_2O_5$, in accordance with some embodiments. The charged layer 320 (or the negative charged layer) is formed using a chemical vapor deposition (CVD) process or another suitable process.

Similarly, when the first-type conductivity is N-type (i.e., the second-type conductivity is P-type), the charged layer 320 is a positive charged layer. Therefore, the charged layer 320 induces negative carriers (e.g., electrons) in the semiconductor substrate 110 to neutralize positive carriers (e.g., electron holes) trapped by the defects D so as to prevent current leakage in the semiconductor substrate 110, in accordance with some embodiments.

In some embodiments, the charged layer 320 (or the positive charged layer) includes silicon nitride, silicon oxide, or silicon carbide, in accordance with some embodiments. The charged layer 320 (or the positive charged layer) is formed using a plasma-enhanced chemical vapor deposition (PECVD) process or another suitable process.

As shown in FIG. 3B, a charged layer 330 is formed over the charged layer 320, in accordance with some embodiments. The charged layer 320 and the charged layer 330 have the same charge polarity and are made of different materials, in accordance with some embodiments. That is, the charged layers 320 and 330 are both negative charged layers or both positive charged layers, in accordance with some embodiments. In some embodiments, the charged layer 320 includes $HfO_2$, and the charged layer 330 includes $Al_2O_3$ or $Ta_2O_5$. The charged layers 320 and 330 may together induce more positive charges than that induced by only the charged layer 320. In some embodiments, the charged layer 330 is not formed.

As shown in FIG. 3C, a passivation layer 340 is formed over the charged layer 330, in accordance with some embodiments. The passivation layer 340 is configured to prevent the charged layers 320 and 330 from damages during the subsequent processes, in accordance with some embodiments. The passivation layer 340 includes any suitable dielectric material, such as silicon oxynitride or silicon oxide. The passivation layer 340 is formed using a CVD process or another suitable process.

As shown in FIG. 3D, steps similar to those of FIGS. 1G-1H are performed, in accordance with some embodiments. The steps further include removing portions of the oxide layer 310, the charged layers 320 and 330, and the passivation layer 340. Each of the through holes H1 or H2 passes through the oxide layer 310, the charged layers 320 and 330, and the passivation layer 340, the semiconductor substrate 110, and the isolation structure 120, in accordance with some embodiments.

The recess R1 passes through the insulating layer 191 and penetrates into the dielectric layer 140 to expose a portion of the wiring layer 152, in accordance with some embodiments. The recess R2 passes through the insulating layer 191, the dielectric layer 140, the passivation layer 160 and 260 and penetrates into the dielectric layer 240 to expose portions of the wiring layer 152 and 254, in accordance with some embodiments.

The conductive structure C1 passes through the oxide layer 310, the charged layers 320 and 330, and the passivation layer 340, the semiconductor substrate 110, the isolation structure 120, the dielectric layer 140, the passivation layer 160 and 260 and penetrates into the dielectric layer 240, in accordance with some embodiments. The conductive structure C1 is electrically connected to the wiring layers 152, 252, and 254, the conductive via structures 154, 258, and 256, and the gates 134 and 234, in accordance with some embodiments.

The conductive structure C2 passes through the oxide layer 310, the charged layers 320 and 330, and the passivation layer 340, the semiconductor substrate 110, and the isolation structure 120 and penetrates into the dielectric layer 140, in accordance with some embodiments. The conductive structure C2 is electrically connected to the wiring layer 152, in accordance with some embodiments. The conductive structures C1 and C2 are electrically isolated from the semiconductor substrate 110 by the insulating layer 191, in accordance with some embodiments.

As shown in FIG. 3E, after the step of FIG. 1I, a passivation layer 192, a redistribution layer 193, a passivation layer 194, under bump metallization (UBM) layers 195, and conductive bumps 196a and 196b are formed, in accordance with some embodiments. The structures and materials of the passivation layer 192, the redistribution layer 193, the passivation layer 194, the UBM layers 195, and the conductive bumps 196a and 196b are the same as those in FIG. 1I, and therefore it is not repeated herein. A thickness T1' of the semiconductor substrate 110 is less than the thickness T2 of the substrate 210, in accordance with some embodiments. In this step, a semiconductor device structure 300 is formed, in accordance with some embodiments.

In some other embodiments, the oxide layer 310 and the charged layers 320 and 330 expose portions of the active regions 114a and 114b and the isolation doped regions 112. For example, the oxide layer 310 and the charged layers 320 and 330 are not continuous, i.e., cover only the isolation doped regions 112 (as shown in FIG. 3E-1), only the active regions 114a and 114b (as shown in FIG. 3E-2), or only the active region 114b and the isolation doped regions 112 adjacent to the active region 114b (as shown in FIG. 3E-3).

Figure 4A:
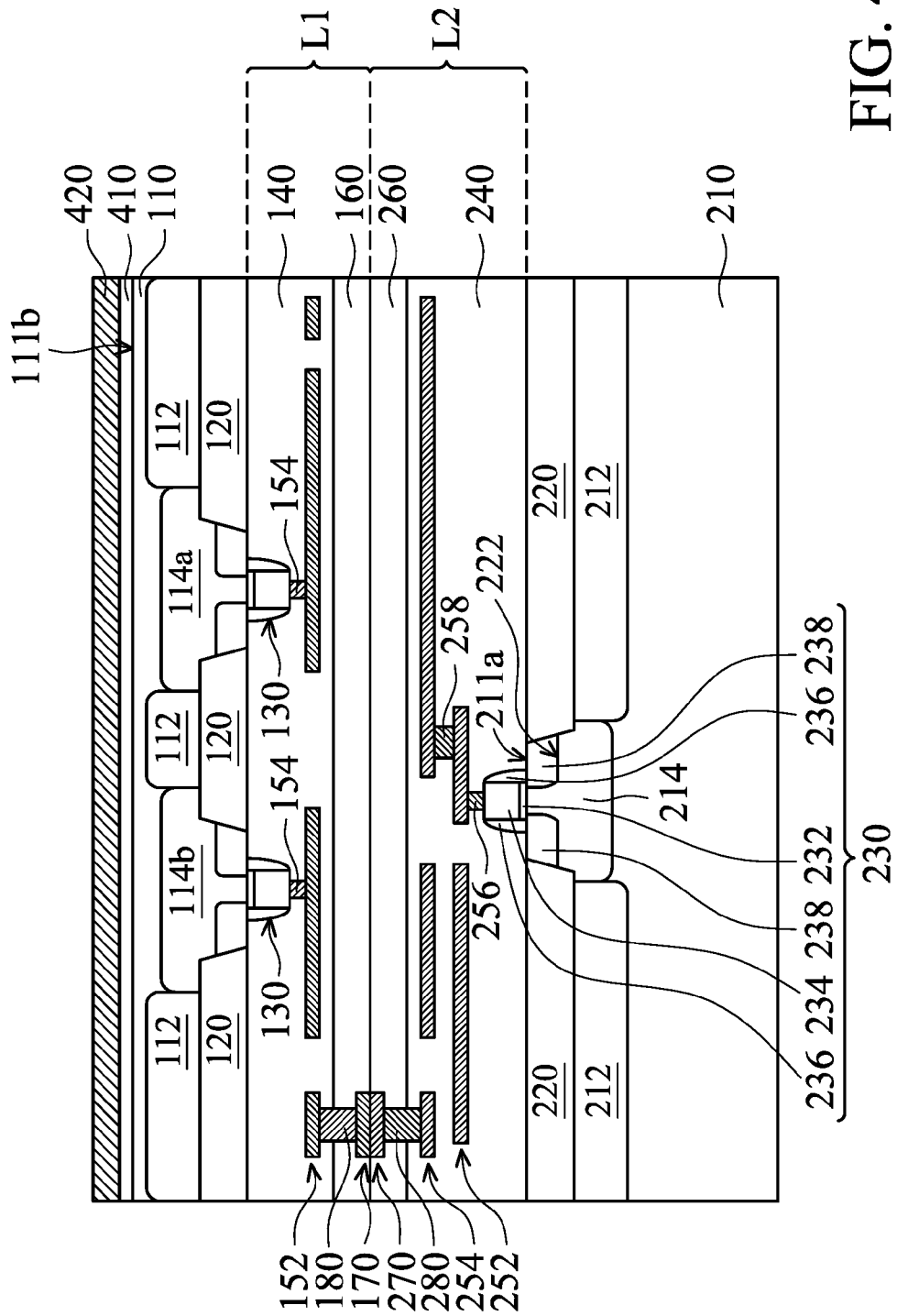
FIGS. 4A-4C are cross-sectional views of various stages of a process for forming a semiconductor device structure, in accordance with some embodiments.
Figure 4B:
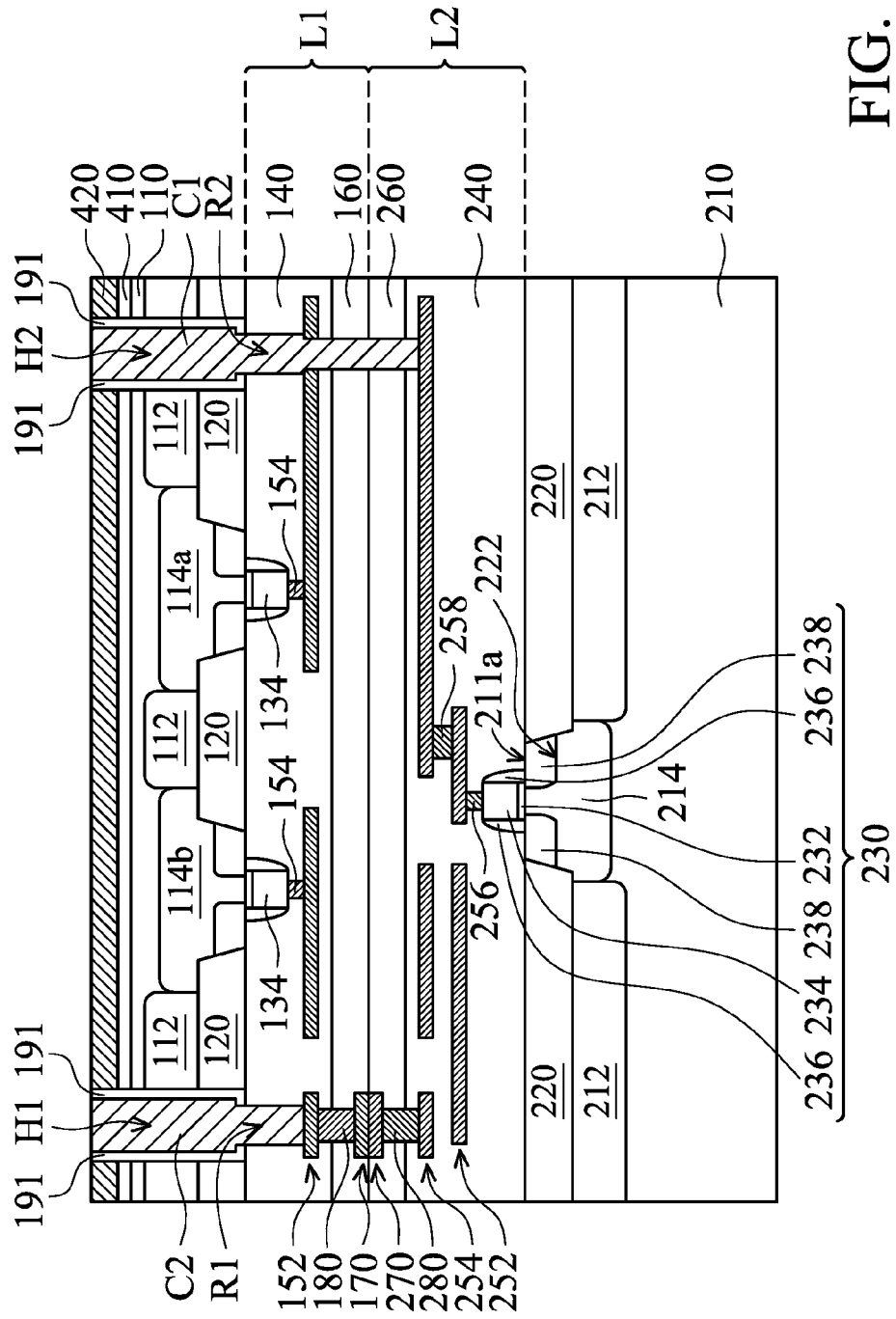
Figure 4C:
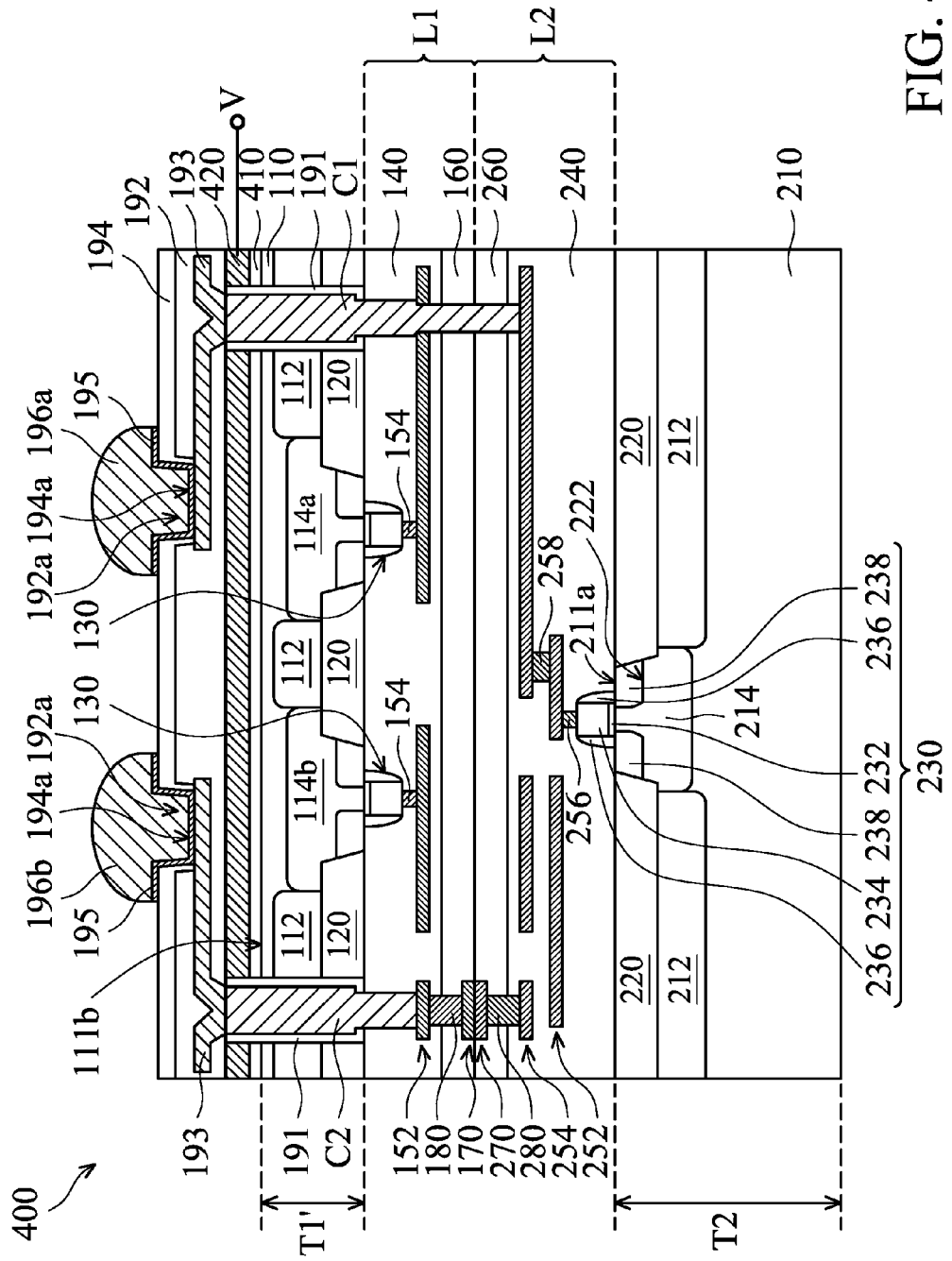
Figures 1, 4C:
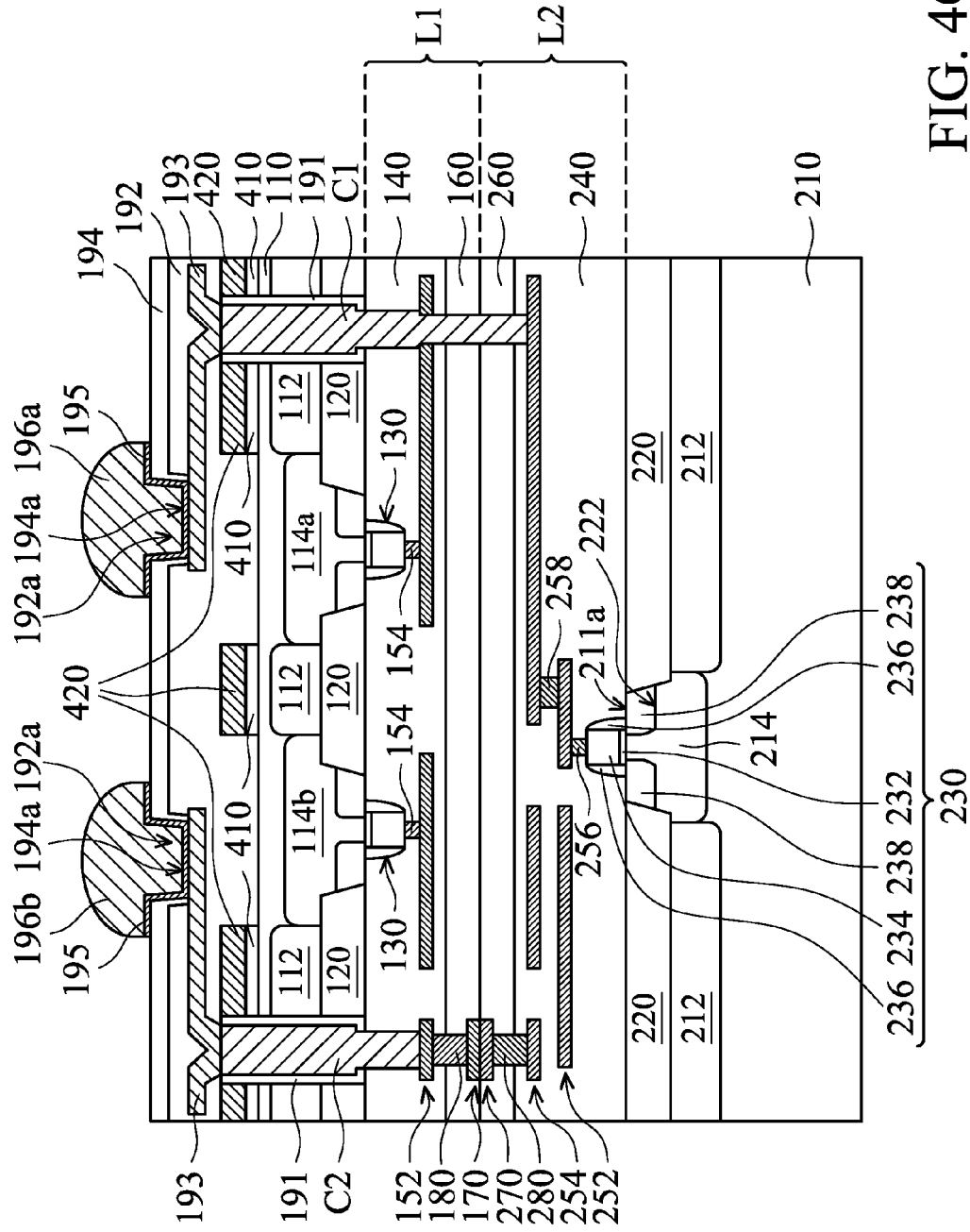
Figures 2, 4C:
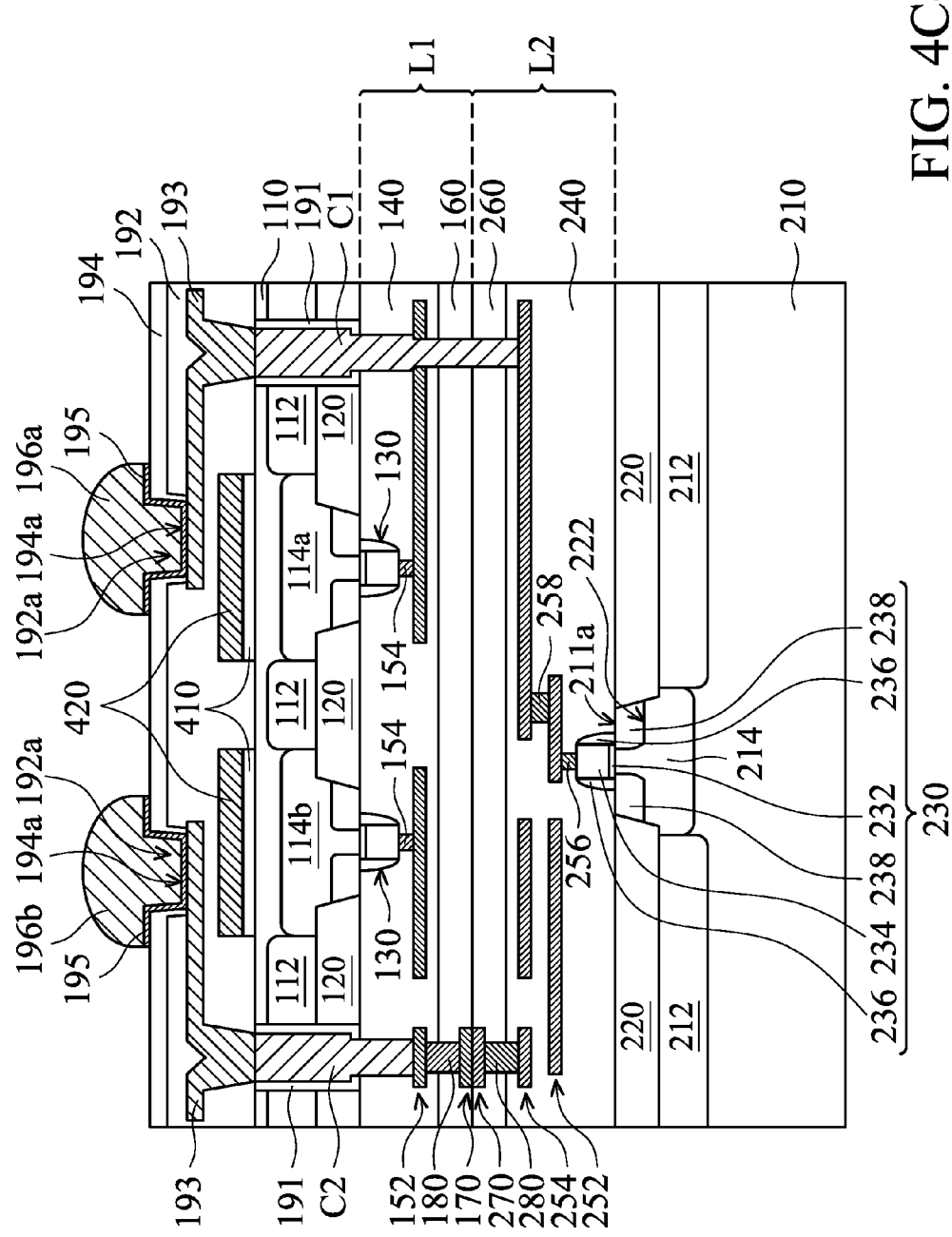
Figures 3, 4C:
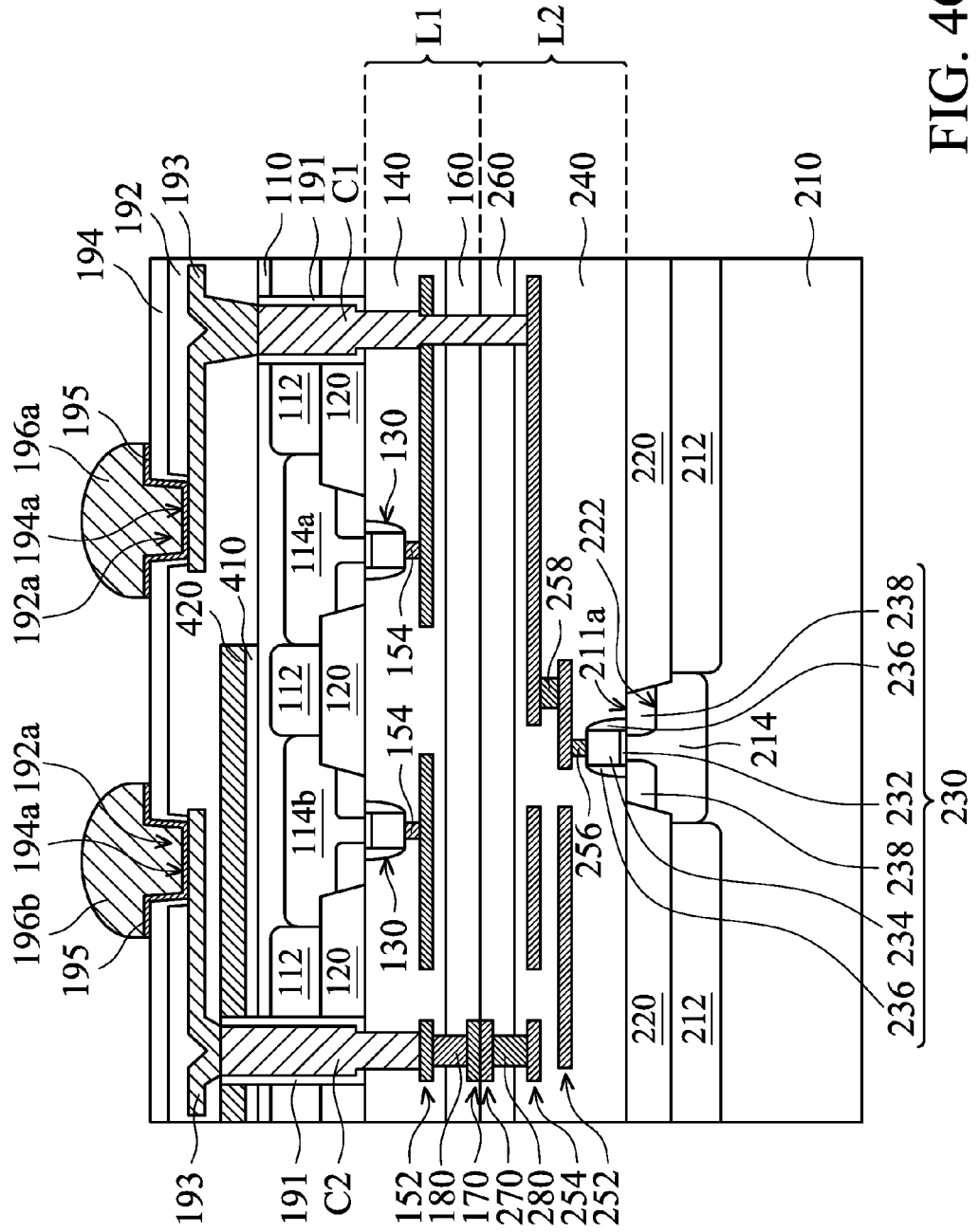

FIGS. 4A-4C are cross-sectional views of various stages of a process for forming a semiconductor device structure 400, in accordance with some embodiments. FIGS. 4C-1 to 4C-3 are cross-sectional views of variations of the semiconductor device structure 400 of FIG. 4C, in accordance with some embodiments.

As shown in FIG. 4A, after the step of FIG. 1E, an insulating layer 410 is formed over the surface 111b of the semiconductor substrate 110, in accordance with some embodiments. The insulating layer 410 includes any suitable insulating material, such as silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

As shown in FIG. 4A, a conductive layer 420 is formed over the insulating layer 410, in accordance with some embodiments. The conductive layer 420 covers the active regions 114a and 114b and/or the isolation doped regions 112, in accordance with some embodiments. The conductive layer 420 includes an opaque conductive material, in accordance with some embodiments. The conductive layer 420 includes a metal material, such as copper, aluminum, or tungsten, in accordance with some embodiments. The conductive layer 420 covers the entire surface 111b, in accordance with some embodiments. The conductive layer 420 covers a portion of the surface 111b, in accordance with some embodiments. The insulating layer 410 electrically isolates the conductive layer 420 from the semiconductor substrate 110, in accordance with some embodiments.

As shown in FIG. 4B, steps similar to those of FIGS. 1G-1H are performed, in accordance with some embodiments. The steps further include removing portions of the insulating layer 410 and the conductive layer 420. Each of the through holes H1 or H2 passes through the insulating layer 410, the conductive layer 420, the semiconductor substrate 110, and the isolation structure 120, in accordance with some embodiments.

The recess R1 passes through the insulating layer 191 and penetrates into the dielectric layer 140 to expose a portion of the wiring layer 152, in accordance with some embodiments. The recess R2 passes through the insulating layer 191, the dielectric layer 140, the passivation layer 160 and 260 and penetrates into the dielectric layer 240 to expose portions of the wiring layer 152 and 254, in accordance with some embodiments.

The conductive structure C1 passes through the insulating layer 410, the conductive layer 420, the semiconductor substrate 110, the isolation structure 120, the dielectric layer 140, the passivation layer 160 and 260 and penetrates into the dielectric layer 240, in accordance with some embodiments. The conductive structure C1 is electrically connected to the wiring layers 152, 252, and 254, the conductive via structures 154, 258, and 256, and the gates 134 and 234, in accordance with some embodiments.

The conductive structure C2 passes through the insulating layer 410, the conductive layer 420, the semiconductor substrate 110, and the isolation structure 120 and penetrates into the dielectric layer 140, in accordance with some embodiments. The conductive structure C2 is electrically connected to the wiring layer 152, in accordance with some embodiments. The conductive structures C1 and C2 are electrically isolated from the semiconductor substrate 110 by the insulating layer 191, in accordance with some embodiments.

As shown in FIG. 4C, after the step of FIG. 1I, a passivation layer 192, a redistribution layer 193, a passivation layer 194, under bump metallization (UBM) layers 195, and conductive bumps 196a and 196b are formed, in accordance with some embodiments. The structures and materials of the passivation layer 192, the redistribution layer 193, the passivation layer 194, the UBM layers 195, and the conductive bumps 196a and 196b are the same as those in FIG. 1I, and therefore it is not repeated herein. The thickness T1' of the semiconductor substrate 110 is less than the thickness T2 of the substrate 210, in accordance with some embodiments.

As shown in FIG. 4C, a voltage V is applied to the conductive layer 420, in accordance with some embodiments. When the first-type conductivity is P-type (i.e., the semiconductor substrate 110 is a P-type semiconductor substrate), the voltage V is negative so as to induce positive carriers (e.g., electron holes) in the semiconductor substrate 110 adjacent to the surface 111b, in accordance with some embodiments. The positive carriers may neutralize negative carriers (e.g., electrons) trapped by the defects D (as shown in FIG. 1E) to prevent current leakage in the semiconductor substrate 110.

Similarly, when the first-type conductivity is N-type (i.e., the semiconductor substrate 110 is a N-type semiconductor substrate), the voltage V is positive so as to induce negative carriers (e.g., electrons) in the semiconductor substrate 110 adjacent to the surface 111b, in accordance with some embodiments. The negative carriers may neutralize positive carriers (e.g., electron holes) trapped by the defects D (as shown in FIG. 1E) to prevent current leakage in the semiconductor substrate 110. In this step, a semiconductor device structure 400 is formed, in accordance with some embodiments.

In some other embodiments, the insulating layer 410 and the conductive layer 420 expose portions of the active regions 114a and 114b and the isolation doped regions 112. For example, the insulating layer 410 and the conductive layer 420 cover only the isolation doped regions 112 (as shown in FIG. 4C-1), only the active regions 114a and 114b (as shown in FIG. 4C-2), or only the active region 114b and the isolation doped regions 112 adjacent to the active region 114b (as shown in FIG. 4C-3).

In accordance with some embodiments, semiconductor device structures are provided. The semiconductor device structures have a doped layer, a charged layer, or a conductive layer over a semiconductor substrate to repair defects in the semiconductor substrate. Therefore, the leakage current in the semiconductor substrate is decreased. As a result, the yield of the semiconductor device structures is improved.

In accordance with some embodiments, a semiconductor device structure is provided. The semiconductor device structure includes a semiconductor substrate having a first surface and a second surface. The semiconductor substrate has an active region. The semiconductor substrate is doped with first dopants with a first-type conductivity. The active region is adjacent to the first surface and doped with second dopants with a second-type conductivity. The semiconductor device structure includes a doped layer over the second surface and doped with third dopants with the first-type conductivity. A first doping concentration of the third dopants in the doped layer is greater than a second doping concentration of the first dopants in the semiconductor substrate. The semiconductor device structure includes a conductive bump over the doped layer.

In accordance with some embodiments, a semiconductor device structure is provided. The semiconductor device structure includes a semiconductor substrate having a first surface and a second surface. The semiconductor substrate has an active region. The semiconductor substrate is doped with first dopants with a first-type conductivity. The active region is adjacent to the first surface and doped with second dopants with a second-type conductivity. The semiconductor device structure includes a first charged layer over the second surface. When the first-type conductivity is P-type, the first charged layer is a negative charged layer. When the first-type conductivity is N-type, the first charged layer is a positive charged layer.

In accordance with some embodiments, a semiconductor device structure is provided. The semiconductor device structure includes a semiconductor substrate having a first surface and a second surface. The semiconductor substrate has an active region. The semiconductor substrate is doped with first dopants with a first-type conductivity. The active region is adjacent to the first surface and doped with second dopants with a second-type conductivity. The semiconductor device structure includes an insulating layer over the second surface. The semiconductor device structure includes a conductive layer over the insulating layer. The conductive layer is over the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate having a first surface and a second surface, wherein the semiconductor substrate has an active region, the semiconductor substrate is doped with first dopants with a first-type conductivity, and the active region is adjacent to the first surface and doped with second dopants with a second-type conductivity;
a first charged layer over the second surface, wherein when the first-type conductivity is P-type, the first charged layer is a negative charged layer, when the first-type conductivity is N-type, the first charged layer is a positive charged layer;
a dielectric layer separating a lower surface of the first charged layer that is closest to the semiconductor substrate from the second surface of the semiconductor substrate, wherein the dielectric layer comprises an oxide; and
a second charged layer over the first charged layer, wherein the first charged layer and the second charged layer have a same charge polarity and are made of different materials.

2. The semiconductor device structure as claimed in claim 1, wherein the first charged layer is a negative charged layer that comprises a high-k material.

3. The semiconductor device structure as claimed in claim 1, wherein the negative charged layer comprises $HfO_2$, $Al_2O_3$, or $Ta_2O_5$.

4. The semiconductor device structure as claimed in claim 1, wherein the dielectric layer comprises a silicon oxide.

5. The semiconductor device structure as claimed in claim 1, wherein the first charged layer is a positive charged layer that comprises silicon oxide, silicon nitride, or silicon carbide.

6. The semiconductor device structure as claimed in claim 1, wherein the first charged layer covers the entire second surface.

7. A semiconductor device structure, comprising:
- a semiconductor substrate having a first surface and a second surface, wherein the semiconductor substrate has an active region, the semiconductor substrate is doped with first dopants with a first-type conductivity, and the active region is adjacent to the first surface and doped with second dopants with a second-type conductivity;
- a first charged layer arranged over the second surface, wherein the first charged layer is configured to neutralize charge carriers trapped by defects within the semiconductor substrate, and wherein the first charged layer is not a continuous film and does not cover an entirety of the second surface; and
- a dielectric layer separating a lower surface of the first charged layer that is closest to the semiconductor substrate from the second surface of the semiconductor substrate, wherein the dielectric layer comprising an oxide.

8. The semiconductor device structure as claimed in claim 7, further comprising:
- a passivation layer arranged on the first charged layer and the second surface, wherein the passivation layer laterally contacts a sidewall of the first charged layer.

9. The semiconductor device structure as claimed in claim 8, further comprising:
- a first device layer arranged along the first surface of the semiconductor substrate; and
- a conductive structure passing through the semiconductor substrate and configured to electrically connect the first device layer to a conductive bump separated from the second surface by the first charged layer.

10. The semiconductor device structure as claimed in claim 9, further comprising:
- a second device layer separated from the semiconductor substrate by the first device layer, wherein the conductive structure passes through the first device layer to electrically connect the conductive bump, the first device layer, and the second device layer.

11. The semiconductor device structure as claimed in claim 9, wherein the conductive structure passes through the passivation layer.

12. The semiconductor device structure as claimed in claim 7, wherein the dielectric layer is configured to repair initial defects within the semiconductor substrate.

13. The semiconductor device structure as claimed in claim 12, further comprising:
- a passivation layer laterally contacting sidewalls of the first charged layer and the oxide layer, and vertically contacting the second surface of the semiconductor substrate.

14. The semiconductor device structure as claimed in claim 13, wherein the first charged layer comprises interior sidewalls that are separated by the passivation layer.

15. The semiconductor device structure as claimed in claim 7, further comprising:
- a second substrate bonded to the first surface, wherein a first thickness of the semiconductor substrate is less than a second thickness of the second substrate.

16. A semiconductor device structure, comprising:
- a semiconductor substrate having a first surface and a second surface, wherein the semiconductor substrate has an active region, the semiconductor substrate is doped with first dopants with a first-type conductivity, and the active region is adjacent to the first surface and doped with second dopants with a second-type conductivity;
- a first charged layer arranged over the second surface, wherein the first charged layer is configured to neutralize charge carriers trapped by defects within the semiconductor substrate;
- a dielectric layer separating a lower surface of the first charged layer that is closest to the semiconductor substrate from the second surface of the semiconductor substrate wherein the dielectric layer comprises an oxide layer; and
- a passivation layer laterally contacting sidewalls of the first charged layer and the oxide layer, and vertically contacting the second surface of the semiconductor substrate.

17. The semiconductor device structure of claim 16, wherein the first charged layer has a bottommost surface facing the semiconductor substrate, which is above a topmost surface of the semiconductor substrate facing the first charged layer.

18. The semiconductor device structure of claim 16, further comprising a second charged layer seperated from the semiconductor substrate by the first charged layer and the dielectric layer.

19. The semiconductor device structure of claim 16, wherein the first charged layer does not cover an entirety of the second surface.

20. The semiconductor device structure of claim 16, wherein the first charged layer comprises silicon oxide, silicon nitride, or silicon carbide.

* * * * *